United States Patent
Wang et al.

(10) Patent No.: US 11,293,986 B2
(45) Date of Patent: Apr. 5, 2022

(54) SYSTEM AND METHOD FOR ESTIMATING TEMPERATURE AND HEAT LOSS IN ELECTRIC MOTORS

(71) Applicants: Mitsubishi Electric Research Laboratories, Inc., Cambridge, MA (US); Mitsubishi Electric Corporation, Tokyo (JP)

(72) Inventors: Bingnan Wang, Belmont, MA (US); Yebin Wang, Cambridge, MA (US); Tong Ma, Storrs, CT (US); Chungwei Lin, Boston, MA (US); Taiga Komatsu, Amagasaki (JP)

(73) Assignees: Mitsubishi Electric Research Laboratories, Inc., Cambridge, MA (US); Mitsubishi Electric Corporation

( * ) Notice: Subject to any disclaimer, the term of this patent is extended or adjusted under 35 U.S.C. 154(b) by 201 days.

(21) Appl. No.: 16/566,338

(22) Filed: Sep. 10, 2019

(65) Prior Publication Data
US 2020/0341062 A1    Oct. 29, 2020

Related U.S. Application Data

(60) Provisional application No. 62/838,519, filed on Apr. 25, 2019.

(51) Int. Cl.
*G01R 31/34*    (2020.01)
*G01N 25/72*    (2006.01)

(52) U.S. Cl.
CPC .......... *G01R 31/343* (2013.01); *G01N 25/72* (2013.01)

(58) Field of Classification Search
CPC ...... G01N 25/72; G01R 31/343; G06F 30/23; H02K 11/25
USPC ........................................... 702/35, 130, 136
See application file for complete search history.

(56) References Cited

U.S. PATENT DOCUMENTS

| | | | |
|---|---|---|---|
| 9,496,817 B1 * | 11/2016 | Lepka | H02P 29/67 |
| 2012/0226483 A1 * | 9/2012 | Berry | G01K 7/42 |
| | | | 703/2 |
| 2020/0119625 A1 * | 4/2020 | Yang | B60L 50/10 |

* cited by examiner

*Primary Examiner* — John H Le
(74) *Attorney, Agent, or Firm* — Gennadiy Vinokur; Hironori Tsukamoto

(57) ABSTRACT

A system for thermal management of an electric motor, uses an augmented thermal circuit model of the electric motor, which relates temperatures of a set of nodes of the thermal circuit model with the temperature measurements at a first subset of nodes and heat losses of heat sources at a second subset of nodes, for joint estimation of the temperatures at the entire set of nodes and values of the heat losses in the second subset of nodes. The system solves the joint estimation using an estimator/observer. The system outputs one or combination of the values of the temperatures of the set of nodes and the values of the heat losses.

18 Claims, 30 Drawing Sheets

219

$$\dot{T}(t) = AT(t) + Bu(t) + V_0$$
$$y_n(t) = CT(t) + n(t)$$

221

$$\begin{bmatrix} \dot{T}(t) \\ u(t) \end{bmatrix} = A_e \begin{bmatrix} T(t) \\ u(t) \end{bmatrix} + V_{e0}$$
$$y_n(t) = C_e \begin{bmatrix} T(t) \\ u(t) \end{bmatrix} + n(t)$$

FIG. 2B

| Thermal flow | Symbol | Unit | Electric flow | Symbol | Unit |
|---|---|---|---|---|---|
| Quantity of heat | $Q_{th}$ | J | Electric charge | Q | C |
| Heat flow | Q | $W/m^2$ | Current density | J | $A/m^2$ |
| Temperature | T | K | Electric potential | V | V |
| Temperature Rise | Θ | K | Voltage | U | V |
| Thermal resistance | $R_{th}$ | K/W | Electric resistance | R | $\Omega = V/A$ |
| Thermal conductance | $G_{th}$ | W/K | Electric conductance | G | $S = A/V$ |
| Thermal capacitances | $H_{th}$ | J/K | Capacitance | C | $F = C/V$ |

SYSTEM AND METHOD FOR ESTIMATING TEMPERATURE AND HEAT LOSS IN ELECTRIC MOTORS

TECHNICAL FIELD

This invention relates generally to the thermal behavior of electric motors, and more generally to real-time estimation of temperature and heat loss distribution in electric motors.

BACKGROUND

Electric motors are one of the most significant energy conversion systems used in industry today. An electric motor is an electric machine that converts electric energy into mechanical energy. The vast majority of the electric motors operate through interaction between the motor's magnetic field and electric current in a wire winding to generate force in the form of rotation of a shaft. The electric motors may be powered by direct current (DC) sources, such as from batteries, motor vehicles or rectifiers, or by alternating current (AC) sources, such as a power grid, inverters or electric generators.

The electric motors need to operate within a specified range of temperature and in the event of overheating the electric motors run the risk of demagnetization of magnets and/or stator winding. Consequently, the overheating may lead to failure of the motor. In some circumstances, the overheating may lead to burn out of the electric motor. For example, due to the overheating of stator winding, the insulation of the stator windings may deteriorate and consequently may lead to short circuit of the stator winding. In some cases, overheating of permanent magnets in the motor may lead to irreversible demagnetization. Further, the failure of the electric motor may result in failure of a whole production system and then the economic consequences may be quite substantial. Therefore, thermal design and management of the electric motor plays a vital role in design and operation of the electric motor.

Heat dissipation is an important issue in the thermal design of electrical machines and especially in the electric motors. Heat sources play a major role in the heat dissipation and is the major mechanism ruling the thermal behavior of the electric motors. The structure, location, and behavior of the heat sources are complicated and difficult to identify completely either theoretically or experimentally. Different kinds of the heat sources result in heat losses, such as copper losses, iron losses, permanent magnet losses, windage losses and the like. For example, the iron losses may be due to both eddy current loss and hysteresis loss. Due to nonlinear nature of magnetic properties of the electric motor material, the losses depend on various factors and are difficult to model accurately. Further, experimentally it is difficult to separate contribution of each of the different kinds of the heat sources for the heat losses. If the heat losses in the electric motor are not identified, then temperatures may not be calculated.

Many studies have been carried out for temperature estimation in the electric motors. However, most of them just focus on temperature estimation of one part or some parts of the electric motors. For example, a method described in U.S. Pat. No. 8,482,237 determines a temperature change at each node to estimate the temperature of the motor based on the determined temperature changes and the thermal resistances in the thermal model. However, this patent is silent about calculation of heat losses, while the temperature increases due to the losses in the electric motor.

Patent EP 1959532 describes a method for temperature monitoring in a permanent magnet electric motor by implementing a real-time thermal model, the parameters of the thermal model are optimized online to minimize the error between measured temperature and estimated temperature. In the embodiment of this patent, the calculation of heat losses are based on empirical rules or experiments. However, when some losses factors are neglected, errors of losses cause obtaining wrong limit conditions for components of the electric motor.

Therefore, there is a need of a method to design an accurate thermal circuit model and estimate both temperature and heat loss information accurately in the electrical motor based on the thermal circuit model.

SUMMARY

It is an object of some embodiments to provide a system and a method for estimating temperature and heat loss information in various components of electric motor. Additionally, or alternatively, it is an object of some embodiments to provide such a method for estimating temperature and heat loss information that uses a thermal circuit model for the motor calibrated in advance, i.e. offline, and measurements from temperature sensors positioned at different locations of the electric motor to collect the measurements during an operation of the motor, i.e. online.

Additionally, or alternatively, it is an object of some embodiments to provide thermal management of the electric motor to complement or avoid the usage of positive thermal coefficient (PTC) sensor. In some embodiments, the real-time thermal model-based management offers more protection than using a PTC sensor applied to one phase, especially in a stall torque situation. The real-time thermal model may estimate the actual temperature in the motor where as a PTC sensor solution only gives a shutdown signal if the temperature is too high in the measured point.

Similar to an electric circuit model, thermal behavior of the electric motor may be described by the thermal circuit model. Hence, some embodiments are based on recognition that the thermal management of the electric motor may be based on a thermal circuit model relating temperatures of components of the electric motor with on-line temperature measurements at some locations of the electric motor. Because it is impractical to measure the temperature of all components of an interest, parameters of the thermal circuit model may relate the temperature of various components at various locations of the electric motor with some temperature measured at limited number of locations.

The thermal circuit model includes a plurality of nodes and at least one thermal resistance. Each node represents a spatial region or a location of the motor and each thermal resistance represents a heat transfer path between at least two of the nodes and thus between the corresponding locations. The concept of thermal circuit may be understood by comparing with an electric circuit, because elements of the thermal circuit model have their corresponding analogy in electrical elements of the electric circuit. Similarly, heat generation in the electric motor may be represented as heat loss or heat generation rate at a specific location. For example, heat generated due to power losses in the stator iron stack, stator winding and rotor may be represented by three heat flow sources: stator iron losses, winding power losses, and magnetizing and eddy current rotor losses.

To that end, the thermal circuit model includes parameters and state variable. The parameters are usually determined in advance, while values of the state variables are determined in real time using the parameters and temperature measurements, i.e. using the relationship among parameters, temperature measurements, and variables determined by a model. Typically, parameters of a thermal circuit model include values of thermal resistance and thermal capacitance of nodes of the thermal circuit model as well as values of heat losses at the location of heat sources described by a subset of nodes while state variables of a thermal circuit model include unmeasured values of the temperature at various locations of the electric motor.

Some embodiments are based on understanding that the thermal circuit model may be calibrated offline using empirical study to determine values of the parameters of thermal circuit model. Specifically, the empirical study may be used to simulate a model of the electrical motor to estimate values of the thermal resistance and thermal capacitance of nodes of the thermal circuit model, estimate locations of the heat sources in the electrical motor and determine the values of the heat losses at the location of heat sources.

After the thermal circuit model is calibrated, i.e. the parameters are determined, real-time temperature estimation for various nodes of the model is performed based on the calibrated values of parameters of the model and real-time temperature measurement. After the thermal circuit model is fully calibrated, such a model is dynamically stable, i.e., the dissipative nature of thermal dynamics in the model includes only negative eigenvalues, and thus is calibrated thermal circuit model is Hurwitz (stable). From estimation theory, for such a model, real-time temperature may be reliably estimated using varies estimators such as Kalman filter, Luenberger observer, regardless of numbers and locations of the where the temperature sensors.

However, some embodiments are based on recognition that values of the heat losses at locations of heat sources are difficult or even impractical to calibrate with the level of accuracy desired for some applications. When the values of the heat losses are inaccurate, the resulted thermal management may be faulty.

Some embodiments are based on realization that heat losses, although could be fast-changing, may be treated as a slow-varying input to the system, because the response of motor temperatures is much slower than the change of heat losses, and so the effect of the variation of the heat losses on the temperature may be averaged. In other words, the effect of fast changing heat losses on the temperature of the electrical motor is similar to the effect of the slow changing heat losses.

Such a realization allows some embodiments to view the heat losses as a part of a state of the electric motor, which in turn allow augmenting a state of the thermal circuit model with the heat losses as an extra state variable. Hence, in referred herein "augmented thermal circuit model," the state variables include both the unmeasured temperature values on the entire set of nodes and the values of the heat losses on the pre-determined subset of nodes, while the location of the unmeasured temperatures and the locations of the heat sources are still part of the predetermined parameters. The augmented thermal circuit model takes advantage from the realization that values of the heat losses may compensate for inaccuracy of location of the heat sources.

It should be noted, the locations of temperature measurements are referred herein as a first subset of the set of nodes or a first subset of nodes to indicate that the temperatures of only subset of nodes are measured. Because nodes are corresponding to physical locations in the electric motor, the first subset of nodes can also be referred as a first subset of locations. Similarly, locations of heat sources in the electric motor are referred herein as a second subset of the set of nodes or a second subset of nodes. In the augmented thermal circuit model, a heat source is mapped to locations of one or multiple nodes. If the heat source is mapped to a single node, the value of the heat losses of such a heat source is generation of heat at a location of the node. When the heat source is mapped to multiple nodes, a value of the heat loss is distributed across the locations of multiple nodes. In different embodiments, the value can be distributed across multiple nodes equally and/or as weighted combination with different weights.

It is further realized that it is possible to jointly estimate both the temperature at the nodes of the augmented thermal circuit model and the heat losses at the location of heat sources of electrical motor. As used herein, jointly means dependently, such that the values of temperature at the nodes of the thermal circuit model and the heat losses at the heat sources of electrical motor are interdependent on each other. Such a joint estimation adds flexibility to state variables estimation, allows correcting inaccuracy of thermal model calibration and to increase the accuracy of both the temperature and heat losses estimation.

However, such an augmentation of the thermal circuit model makes the thermal dynamics represented by an augmented model unstable. As a result, applying estimators suitable for original thermal circuit model may not end up with reliable temperature estimation.

Some embodiments are based on realization that such a deficiency of the augmented thermal circuit model may be corrected with the help of observability test focused on the heat sources. In control theory, observability is a measure of how well internal states of a system may be inferred from knowledge of its external outputs. In this case, for the augmented thermal circuit model, the observability test relates heat losses at the heat sources with temperature measurements.

Specifically, to satisfy the observability test, some embodiments select a number of temperature measurements at different locations, specified by a first subset of nodes, to be equal a greater than a number of heat sources in the thermal circuit model. For example, one embodiment relates the elements of the augmented thermal circuit model according to the observability test. In this embodiment, a rank of a matrix modeling a combination of thermal capacitances, thermal resistances, temperature measurements, and heat losses of the thermal circuit model not greater than a sum of a number of nodes in the thermal circuit model with a number of heat sources in the thermal circuit model. Such a matric is referred herein as a thermal management matrix.

Accordingly, one embodiment discloses a system for a thermal management of an electric motor, including a memory configured to store an augmented thermal circuit model of the electric motor relating temperatures of a set of nodes of the thermal circuit model with temperature measurements at the first subset of the set of nodes and values of heat losses of heat sources at a second subset of the set of nodes, wherein each node in the thermal circuit model represents a spatial location of the electric motor, wherein the locations of first subset of nodes and the second subset of nodes are predetermined, while values of the temperatures at the first subset of nodes and values of the heat losses at the second subset of nodes are unknown, such that the temperatures of the set of nodes and values of the heat losses are state variables of the augmented thermal circuit model, and wherein a number of temperature measurements is equal or greater than a number of heat sources; an input interface configured to accept temperature measurements at the locations of the first subset of nodes; a processor configured to jointly estimate the values of the temperatures at the set of nodes and the values of the heat losses in the second subset of nodes by solving a joint estimation problem using the augmented thermal circuit model populated with the temperature measurements for the first subset of nodes, wherein, in the joint estimation, the values of the temperatures at the set of nodes and the values of the heat losses in the second subset of nodes are interdependent on each other; and an output interface configured to output one or combination of the values of the temperatures of the set of nodes and the values of the heat losses in the second subset of nodes.

Another embodiment discloses a method for a thermal management of an electric motor, wherein the method uses a processor coupled to a memory storing an augmented thermal circuit model of the electric motor relating temperatures of a set of nodes of the thermal circuit model with temperature measurements at the first subset of the set of nodes and values of heat losses of heat sources at a second subset of the set of nodes, wherein each node in the thermal circuit model represents a spatial location of the electric motor, wherein the locations of first subset of nodes and the second subset of nodes are predetermined, while values of the temperatures at the first subset of nodes and values of the heat losses at the second subset of nodes are unknown, such that the temperatures of the set of nodes and values of the heat losses are state variables of the augmented thermal circuit model, and wherein a number of temperature measurements is equal or greater than a number of heat sources, the processor is coupled with stored instructions when executed by the processor carry out steps of the method, including accepting temperature measurements at the locations of the first subset of nodes; jointly estimating the values of the temperatures at the set of nodes and the values of the heat losses in the second subset of nodes by solving a joint estimation problem using the augmented thermal circuit model populated with the temperature measurements for the first subset of nodes, wherein, in the joint estimation, the values of the temperatures at the set of nodes and the values of the heat losses in the second subset of nodes are interdependent on each other; and outputting one or combination of the values of the temperatures of the set of nodes and the values of the heat losses in the second subset of nodes.

Yet another embodiment discloses a non-transitory computer readable storage medium embodied thereon a program executable by a processor for performing a method, the storage medium stores an augmented thermal circuit model of the electric motor relating temperatures of a set of nodes of the thermal circuit model with temperature measurements at the first subset of the set of nodes and values of heat losses of heat sources at a second subset of the set of nodes, wherein each node in the thermal circuit model represents a spatial location of the electric motor, wherein the locations of first subset of nodes and the second subset of nodes are predetermined, while values of the temperatures at the first subset of nodes and values of the heat losses at the second subset of nodes are unknown, such that the temperatures of the set of nodes and values of the heat losses are state variables of the augmented thermal circuit model, and wherein a number of temperature measurements is equal or greater than a number of heat sources, the program when executed by the processor carry out steps of the method, including accepting temperature measurements at the locations of the first subset of nodes; jointly estimating the values of the temperatures at the set of nodes and the values of the heat losses in the second subset of nodes by solving a joint estimation problem using the augmented thermal circuit model populated with the temperature measurements for the first subset of nodes, wherein, in the joint estimation, the values of the temperatures at the set of nodes and the values of the heat losses in the second subset of nodes are interdependent on each other; and outputting one or combination of the values of the temperatures of the set of nodes and the values of the heat losses in the second subset of nodes.

BRIEF DESCRIPTION OF THE DRAWINGS

FIG. 2B shows a schematic of augmenting a regular thermal circuit model with heat source as a state variable according to some embodiments.

FIG. 3A shows a table exhibiting analogous thermal and electrical quantities.

FIG. 5B shows transformation of an example matrix C containing continuous elements into matrix C* containing absolute values, according to some embodiments.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure.

As used in this specification and claims, the terms "for example." "For instance." and "such as, and the verbs "comprising," "having." "including." and their other verb forms, when used in conjunction with a listing of one or more components or other items, are each to be construed as open ended, meaning that that the listing is not to be considered as excluding other, additional components or items. The term "based on" means at least partially based. Further, it is to be understood that the phraseology and terminology employed herein are for the purpose of the description and should not be regarded as limiting. Any heading utilized within this description is for convenience only and has no legal or limiting effect.

System Overview

Figure 1A:
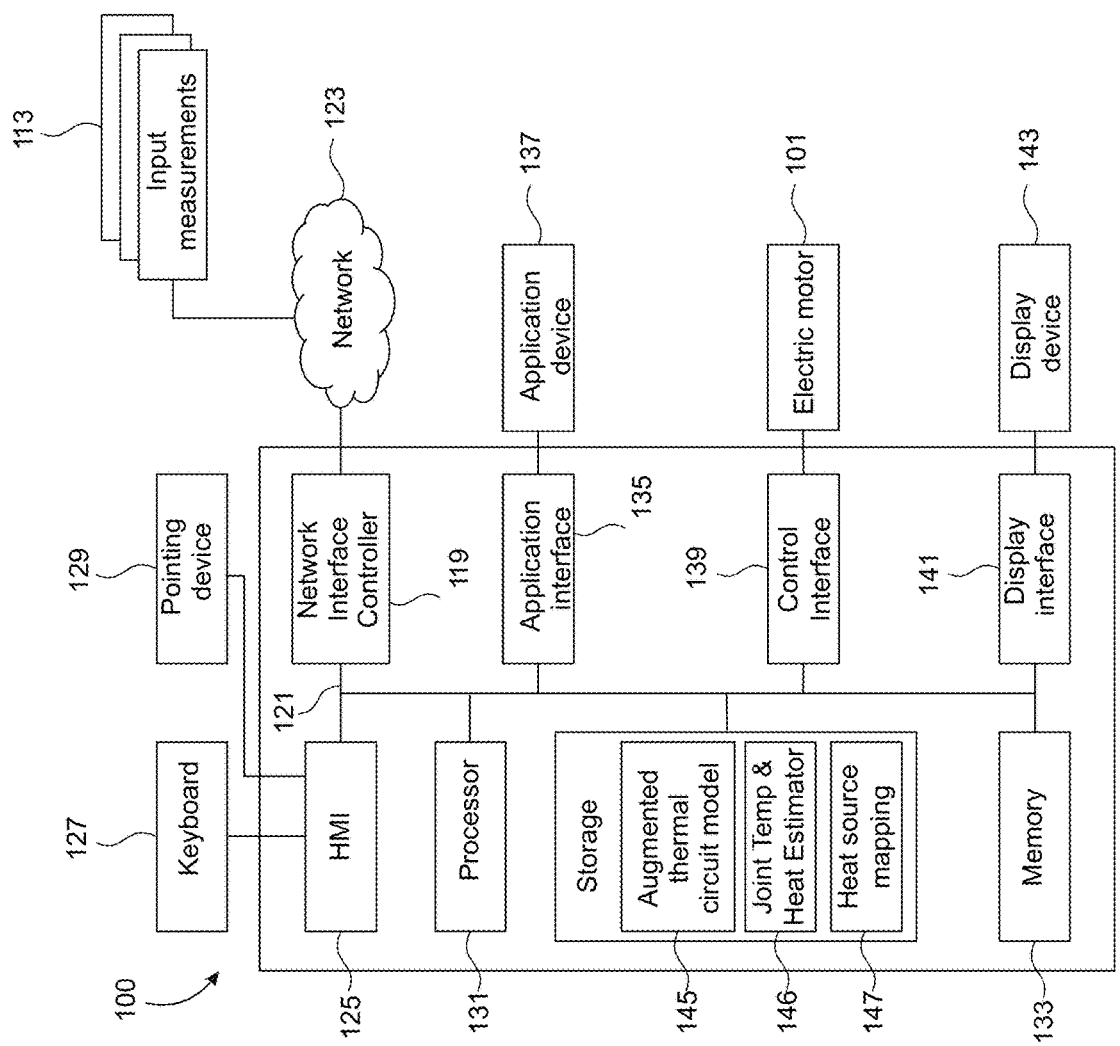
FIG. 1A and FIG. 1B show block diagrams of a system for thermal management of an electric motor, according to some embodiments.
Figure 1B:
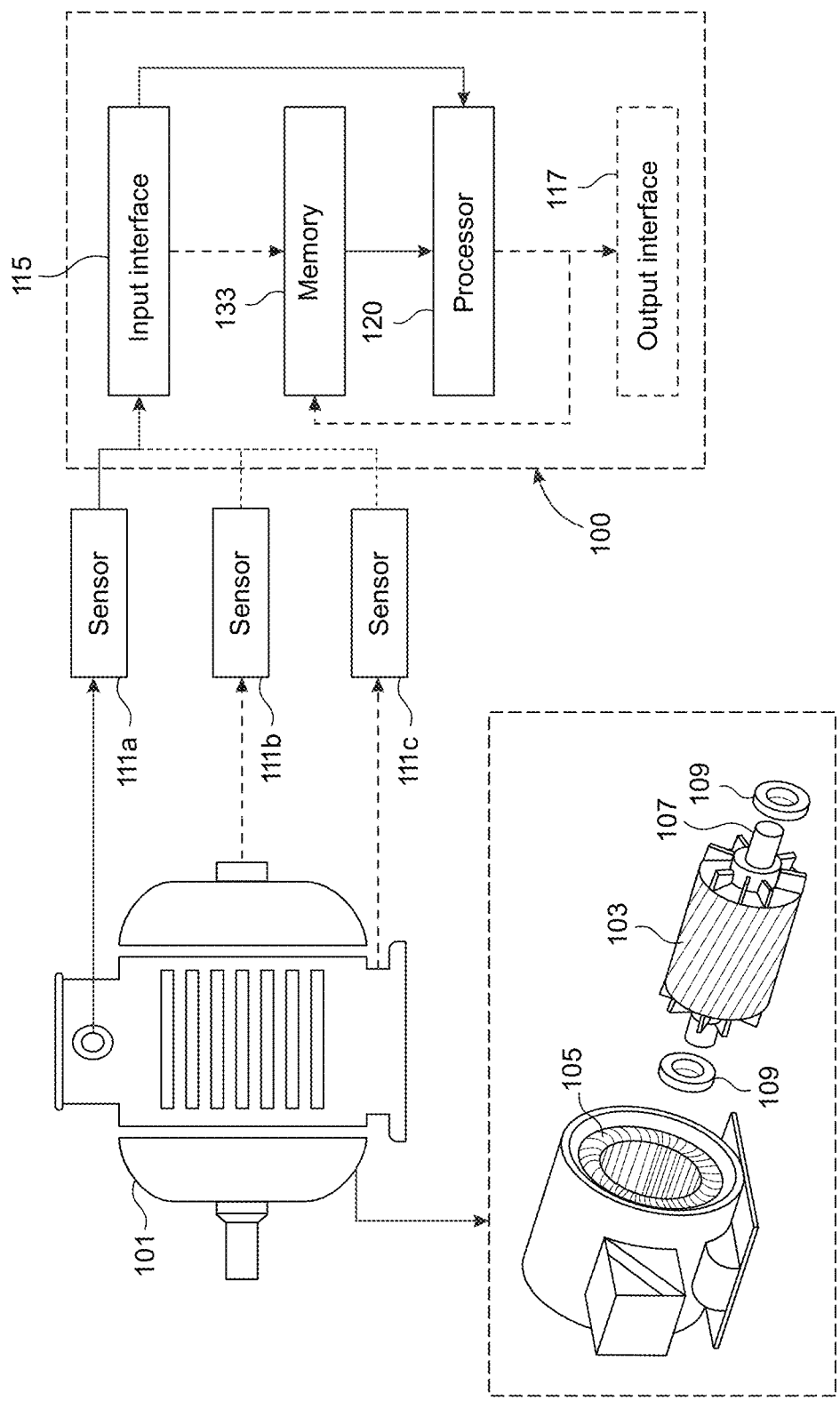

FIG. 1A and FIG. 1B show block diagrams of a system 100 for thermal management of an electric motor 101 according to some embodiments. For example, an electric motor 101 includes a rotor assembly 103, a stator assembly 105, a main shaft 107, and two main bearings 109. The electric motor 101 may be any one of a DC motor, an AC motor, a synchronous motor and the like.

The system 100 may be used for monitoring and controlling the operation of the electric motor 101 by taking various measurements as inputs in accordance with one or more example embodiments described herein. For example, a controller coupled with the electric motor 101 and the system 100 may control operations of the electric motor 101 based on inputs received from sensors 111a, 111b, and/or 111c. The sensors 111a, 111b, and/or 111c are configured to acquire input measurements 113 pertaining to operating conditions of the electric motor 101. According to certain embodiments, the sensors 111a, 111b, and/or 111c may be current and/or voltage sensors for acquiring current and voltage data pertaining to the electric motor 101. For example, in case of the induction motor, the current sensor senses current data from one or more of the multiple phases of the induction motor. In some implementations, input measurements 113 are measurements of voltage and current of the stator 104. In some embodiments, at least one sensor of the sensors 111a, 111b, and/or 111c is a temperature sensor. The temperature sensor produces temperature data of the electric motor 101. The temperature is measured by the sensors at various parts or locations of the electric motor 101. The places of temperature measurements are referred herein as a first subset of locations.

The system 100 is configured for thermal management of the electric motor 101. Examples of thermal management of the electric motor 101 include temperature monitoring of the electric motor, controlling the electric motor 101 based on real time estimation of temperature at different parts of the electric motor 101, and active cooling of the electric motor based on its temperature estimation. For example, in one embodiment, if the estimated real time temperature of the motor exceeds a specified value, the system 100 may interrupt the operation of the electric motor 101 for further inspection or repair. In another embodiment, if the estimated temperature of the motor exceeds a threshold value, the system 100 may increase rate of circulation of cooling fluids in or around the electric motor 101.

The system 100 may include an input interface 115 and an output interface 117 for connecting the system 100 with other systems and devices. In some embodiments, the system 100 may include a plurality of input interfaces and a plurality of output interfaces. The input interface 115 is configured to accept temperature measurements at the first subset of locations at the electric motor 101.

The input interface 115 may include a network interface controller (NIC) 119 adapted to connect the system 100 through a bus 121 to a network 123. Through the network 123, either wirelessly or through wires, the system 100 may receive the input measurements 113. The input measurements 113 are measurements from one or a combination of the sensors 111a, 111b, and/or 111c or data derived from measurements of physical variables of an operation of the electric motor 101. Examples of such physical variables include currents and/or voltages of a motor moving a mass. In some implementations, a human machine interface (HMI) 125 within the system 100 connects the system 100 to a keyboard 127 and pointing device 129. The pointing device 112 may include a mouse, trackball, touchpad, joystick, pointing stick, stylus, or touchscreen, among others. Through the interface 110 or NIC 150, the system 100 may receive data, such as measurements of operation of the electric motor 101.

The system 100 may further include a processor 131 and a memory 133 that stores instructions that are executable by the processor 131. The processor 131 may be a single core processor, a multi-core processor, a computing cluster, or any number of other configurations. The memory 133 may include random access memory (RAM), read only memory (ROM), flash memory, or any other suitable memory system. The processor 131 is connected through the bus 121 to one or more input and output devices. The stored instructions implement a method for simultaneously determining (i.e. joint estimation of) temperature and heat loss information in the electrical motor 101.

The memory 133 is also configured to store an augmented thermal circuit model 145 of the electric motor 101. The augmented thermal circuit model 145 relates temperatures of a set of nodes of the thermal circuit model with the temperature measurements at the first subset of locations and values of heat losses at a second subset of locations of the electric motor 101. The first subset of locations and the second subset of locations are predetermined, while values of the temperatures at the first subset of locations and values of the heat losses at the second subset of locations are unknown. In the augmented thermal circuit model 145, the temperatures of a set of nodes and the heat losses at a second subset of locations are state variables that are jointly determined by the processor 131 to fit the measurements of the temperature at the first subset of locations. To that regard, the temperatures at the nodes and values of heat losses are interdependent on each other, i.e., change in temperatures can result in a change in the value of heat losses and vice versa.

It should be noted that the locations of temperature measurements are referred herein as a first subset of the set of nodes or a first subset of nodes to indicate that the temperatures of only subset of nodes are measured. Because nodes are corresponding to physical locations in the electric motor, the first subset of nodes can also be referred as a first subset of locations. Similarly, locations of heat sources in the electric motor are referred herein as a second subset of the set of nodes or a second subset of nodes. In the augmented thermal circuit model, a heat source is mapped to locations of one or multiple nodes. If the heat source is mapped to a single node, the value of the heat losses of such a heat source is generation of heat at a location of the node. When the heat source is mapped to multiple nodes, a value of the heat loss is distributed across the locations of multiple nodes. In different embodiments, the value can be distributed across multiple nodes equally and/or as weighted combination with different weights.

In some implementations, the first subset of locations of temperature measurements includes only locations at stationary parts of the electrical motor 101. The second subset of locations correspond to locations of heat sources and are selected by a designer in advance based on knowledge of physics of the electric motor 101. In some embodiments, the second subset of locations is governed by a thermal circuit model itself. The second subset of locations i.e., locations of heat sources are known but values of heat losses at second subset of locations are unknown. Further, the second subset of locations may be distributed across multiple nodes. The size of the first subset of locations of temperature measurements is equal or greater than the size of the second subset of locations of heat sources. Further, the size of the first subset of locations of temperature measurements is less than the size of the set of temperatures of set of components in the thermal circuit model.

A thermal circuit model, such as the augmented thermal circuit model 145, includes parameters and state variables. The parameters are determined in advance, while values of the state variables are determined in real time using the parameters and temperature measurements, i.e. using the relationship among parameters, temperature measurements, and variables determined by a model. Typically, parameters of a thermal circuit model include values of thermal resistance and thermal capacitance of nodes of the thermal circuit model as well as values of heat losses at the location of heat sources, while state variables of a thermal circuit model include unmeasured values of the temperature at various locations of the electric motor.

Some embodiments are based on understanding that the thermal circuit model may be calibrated offline using empirical study to determine values of the parameters of thermal circuit model. Specifically, the empirical study may be used to simulate a model of the electrical motor to estimate values of the thermal resistance and thermal capacitance of nodes of the thermal circuit model, estimate locations of the heat sources in the electrical motor and determine the values of the heat losses at the location of heat sources.

However, some embodiments are based on recognition that values of the heat losses at locations of heat sources are difficult or even impractical to calibrate with the level of accuracy desired for some applications. When the values of the heat losses are inaccurate, the resulted thermal management may be faulty.

Some embodiments are based on realization that heat losses, although could be fast-changing, may be treated as a slow-varying input to the system, because the thermal dynamics of the motor change much slower than the values of heat loses, and the effect of the variation of the heat losses on the temperature may be averaged. In other words, the effect of a fast changing heat loses on the temperature of the electrical motor is similar to the effect of the slow changing heat loses.

Such a realization allows some embodiments to view the heat losses as a constant variable, which in turn allow augmenting a state of the thermal circuit model with the heat losses as an extra state variable. In the new solution overview thermal circuit model, the state variables include both the unmeasured temperature values and the values of the heat losses while the location of the unmeasured temperatures and the locations of the heat sources are still part of the predetermined parameters. The augmented thermal circuit model take advantage from the realization that values of the heat losses may compensate for inaccuracy of location of the heat sources.

In some embodiments, the augmented thermal circuit model 145 may be unstable and may be stabilized by applying specific constraints. The augmented thermal circuit model 145 may include heat source as a state variable, wherein the heat source is a function of time. In some embodiments, the augmented thermal circuit model 145 stored in the memory 133 may be stabilized based on satisfaction of an observability test. For example, one embodiments use additional number of temperature sensors such that a number of temperature measurements is equal or greater than a number of heat sources.

In some embodiments, the processor 131 designs different observers using the augmented thermal circuit model 145. The augmented thermal circuit model 145 and the temperature measurements are utilized to jointly estimate, by the processor 131, values of the temperatures at the set of nodes and values of the heat losses in the second subset of locations. To that end, the memory 140 stores a joint estimator 146 to jointly estimate values of the temperatures at the set of nodes and values of the heat losses in the second subset of locations by solving a joint estimation problem using the thermal circuit model populated with the temperature measurements for the first subset of locations. The values of the temperatures at the set of nodes and the values of the heat losses in the second subset of locations are interdependent on each other.

In some embodiments, the memory 140 is configured to optionally store heat source mapping for initial estimation of real-time estimator/observer to identify heat loss in real time, where operating points of the electric motor 101 may be changing with time. Although, FIG. 1A depicts that the heat source mapping 147 is stored in the memory 133, in some alternate embodiments, the heat source mapping 147 may be stored in a data source that is external to the system 100. Some other embodiments do not use the heat source mapping 147. The heat source mapping 147 may comprise different heat sources mapped with respective operating points.

The output interface 117 is configured to output one or a combination of values of the temperatures of set of components and values of the heat losses in a subset of locations. The system 100 may be linked through the bus 121 to a display interface 141 adapted to connect the system 100 to a display device 143, such as a computer monitor, television, projector, or mobile device, among others. The system 100 may also be connected to an application interface 135 adapted to connect the system 100 to an application device 137 for performing various operations. The system 100 may also be connected to a control interface 139 adapted to connect the system 100 to the electric motor 101. For example, through the control interface 139, the system 100 may be configured to control the electric motor 101 based on results of the joint estimation.

Figure 2A:
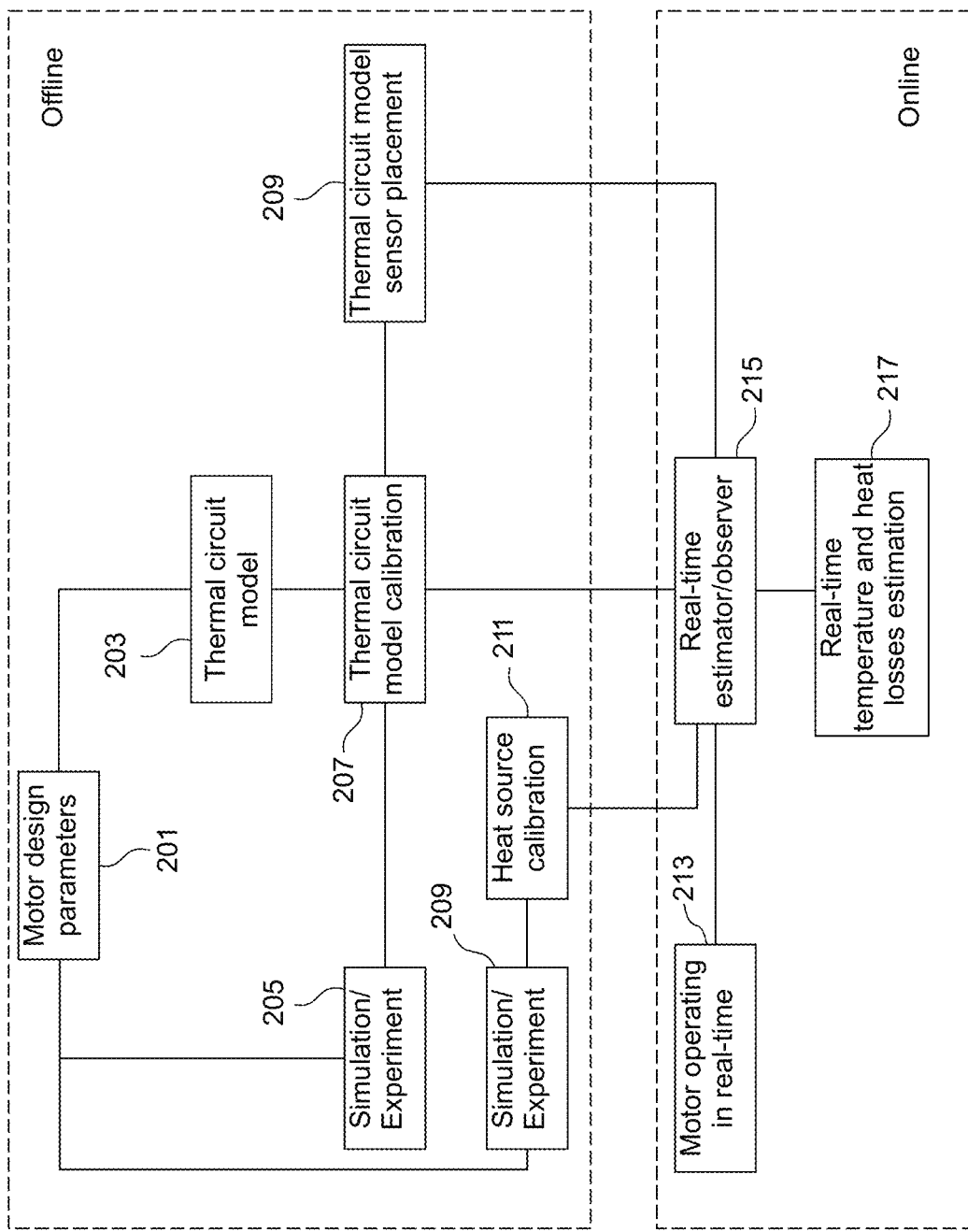
FIG. 2A shows a schematic overview of the invention, according to some embodiments.

FIG. 2A shows a schematic overview of some principles of thermal management, according to some embodiments. It is an objective of some embodiments to determine the temperature and the heat loss jointly in real-time. Typically, heat sources are the main reason for heat dissipation and are the major mechanism ruling thermal behavior of the electric motors. A heat source is a type and a place of energy transformation causing the heat loss. Heat loss is a value of heat generation/loss at a location of heat source. Different kinds of the heat sources result in heat losses (or equivalently heat generation), such as copper losses, iron losses, permanent magnet losses, windage losses and the like. The process of joint estimation of values of the temperatures and heat losses includes two stages, namely, offline stage and online stage. The offline state is performed in advance, i.e., before the operation of the motor begins. The online stage is performed in real time during the operation of the motor.

The offline stage includes obtaining the electric motor design parameters 201 and determining a thermal circuit model 203 based on the electric motor design parameters 201. In some embodiments, the motor design parameters 201 may include geometry of the motor, thermal characteristics of motor materials such as thermal conductivity and thermal capacity. The thermal circuit model 203 contains thermal elements including thermal resistances and thermal capacitances, and the heat sources. Thermal resistances and capacitances are determined by the geometrical and material properties of the electric motor. The number of heat sources and corresponding locations are also identified in the thermal circuit model 203 to describe the heat losses in the electric motor. However, some or all of the exact values of the heat losses may not be known.

A heat source may be defined by two components namely, heat loss location and corresponding heat loss values. Some embodiments are based on recognition that, the heat loss values at all the heat source locations can be determined offline as part of calibration of the thermal circuit model 203. However, the predetermined heat losses suffer from inaccuracy. The heat sources are a function of time and depend on operating points of the electric motor which are time varying and on time varying physics of temperature distribution. Typically, the heat losses determined offline are inaccurate. The accuracy of heat loss measurement is increased by estimating the heat losses online. The present disclosure discloses a method for online real-time joint estimation of values of the temperatures and the heat losses. In some embodiments, the locations of the heat losses are determined offline and the values of the heat losses are estimated online. The locations of the heat losses are determined offline since a designer may select them in advance based on knowledge of physics of the electric motor. As the values of the heat losses are estimated online, the estimated values are based on the real-time operating points of the electric motor, thereby increasing the accuracy of the heat losses estimation. Further, in the joint estimation, as the values of the temperatures and the values of the heat losses are interdependent on each other, increase in the accuracy of the heat losses estimation increases the accuracy of values of the temperatures.

In some embodiments, the thermal circuit model may be an ordinary differential equations (ODE) model. In some embodiments, the thermal circuit model takes the form of partial differential equations (PDE). Physics-based modeling of the temperature distribution of the electric motor yields a PDE model (a system of partial differential equations with heat sources). Model reduction of the PDE model is employed to obtain an ODE model (a set of ordinary differential equations with heat sources). The ODE model describes how temperature at finite spatial locations evolves over time. Heat sources in the PDE model may be a distribution of thermal energy injected into the motor; or lumped thermal energy injected at a finite location.

Further, appropriate simulations and/or experiments 205 are conducted. In some embodiments, the simulations and/or experiments 205 may include high accuracy numerical models such as finite-element models (FEM). Further, in some embodiments, the PDE model may be used as the high accuracy numerical model. A thermal circuit model is calibrated 207 based on data from the conducted simulations and/or experiments 205.

Based on the calibrated thermal circuit model 207, a number of temperature sensors and corresponding locations 209 are determined in order to identify unknown heat sources in a reliable manner. Further, simulations and/or experiments 209 are conducted to calibrate heat source 211 at different operating points of the electric motor. The operating points may include voltage across the electric motor, current through the electric motor and speed of the electric motor. Different heat losses are mapped with respective operating points and a heat source mapping database is formed. The heat source mapping database is utilized for initial estimation of real-time estimator/observer 215 to identify heat source in real time, where the operating points may be changing with time. In the online stage, based on the calibrated thermal circuit model 207 and the heat source calibration 211, a real time estimator/observer 215 is designed for real-time estimation of temperature and heat source. In some embodiments, the heat losses are determined in real time without the initial estimation i.e. heat source calibration 211 is excluded. In some embodiments, the calibrated circuit model 207 is augmented with the heat source as a state variable.

FIG. 2B shows a schematic of augmenting a regular thermal circuit model 219 with heat source as a state variable according to some embodiments. In the regular thermal circuit model 219, the temperature (denoted as $\dot{T}$) is considered as a state variable, whereas in the augmented thermal circuit model 221, the temperature $\dot{T}$ as well as the heat source u(t) are incorporated as state variables. However, the augmented thermal circuit model 221 is unstable. As a result of this, applying a real-time observer with a certain temperature measurement may yield unreliable temperature estimation.

It is an objective of some embodiments to stabilize the augmented thermal circuit model 221 so as to make it suitable for joint estimation of temperature and heat losses. In some embodiments, certain constraints are incorporated into the augmented thermal circuit model 221 such that the augmented thermal circuit model 221 satisfies an observability test. An observability test used by some embodiments of the disclosure determines how well internal states (u(t) and/or T(t)) of a system i.e., the augmented thermal circuit model 221 of the electric motor can be inferred from knowledge of its outputs (temperature measurements y). Further, based on the augmented thermal circuit model 221 incorporated with the constraints, the real-time estimator/observer 215 is designed.

The real-time estimator/observer 215 utilizes operating conditions of a motor operating in real-time 213 to estimate real-time temperature and real-time heat losses.

Solution Overview

Motor temperature estimation is typically conducted based on the following thermal circuit model which is derived from a thermal circuit network:

$$H\dot{T}(t) = AT(t) + Bu(t) + Vv$$

$$y = CT$$

where,

H: capacitance matrix determined by thermal capacitances in the circuit model.
dim[H(·)]=n×n,
A: resistance matrix determined by thermal resistances in the circuit model.
dim[A(·)]=n×n,
T(t): vector representing temperature at all nodes at time t, T(t)∈R$^n$,
u(t): input vector representing the heat sources. u(t)∈R$^p$. p is the number of heat sources in the circuit model,
B: input heat source matrix representing the location of the heat sources. dim[B(·)]=n×p.
In addition, the contributions from constant-temperature boundaries may be separated:
v: a vector representing constant-temperature boundaries. v∈R$^q$, q is the number of boundaries,
V: a matrix representing the location of the constant-temperature boundaries. dim[B(·)]=n×q,
y: measured temperature at p locations with p<n,
C: temperature sensor matrix defining the first subset of locations or defining temperature sensor placements.

The H matrix is always non-singular, and thus, the equation above may be reformulated into a standard state-space model:

$$\dot{T}(t) = A_2 T(t) + B_2 u(t) + V_2 v$$

$$y = CT$$

In the equation, $A_2 = H^{-1}A$, $B_2 = H^{-1}B$ and $V_2 = H^{-1}V$.

In some embodiments, u(t) may be considered as a constant parameter, and the thermal circuit model may be augmented by including the u(t) as an extra state variable. The augmented thermal circuit model is formulated as below:

$$\begin{bmatrix} \dot{T}(t) \\ \dot{u}(t) \end{bmatrix} = \begin{bmatrix} A & B \\ 0_{m \times n} & 0_{m \times m} \end{bmatrix} \begin{bmatrix} T(t) \\ u(t) \end{bmatrix} + \begin{bmatrix} V \\ 0_{m \times q} \end{bmatrix} v$$

$$y_n(t) = [C \; 0_{p \times m}] \begin{bmatrix} T(t) \\ [u(t)] \end{bmatrix} + n(t)$$

Typically, heat source u(t) is calibrated offline using empirical knowledge. However, there exist mismatch between offline calibrated u(t) and its true value, which compromises the temperature estimation accuracy. Further, the offline calibration is cumbersome and requires a lot of time. In the present disclosure, u(t) and T(t) are jointly estimated at real-time by the processor 125 of the system 100. Real-time temperature estimation is performed based on the model knowledge of augmented thermal circuit model and real-time temperature measurement y(t). In some embodiments, the augmented thermal circuit model is stored in the memory 133.

However, for the above augmented thermal circuit model, the matrix $$\begin{bmatrix} A & B \\ 0 & 0 \\ C0 & \end{bmatrix}$$

is not Hurwitz (stable) anymore. As a result, applying Kalman filter with a certain measurement matrix C may yield unreliable temperature estimation. This leads to a joint estimation problem. The joint estimation problem is solved by stabilizing the augmented thermal circuit model such that the matrix pair $$\left( \begin{bmatrix} A & B \\ 0 & 0 \end{bmatrix}, [C, \; 0] \right)$$

is detectable, which, in other words, requires the following rank condition to be satisfied.

$$\text{rank} \begin{bmatrix} A & B \\ 0 & 0 \\ C & 0 \end{bmatrix} = n + m$$

Here n is the number of nodes of the circuit model, and m is the number of heat sources considered in the thermal circuit model. The matrix $$\begin{bmatrix} A & B \\ 0 & 0 \\ C0 & \end{bmatrix}$$

is referred herein as a thermal management matrix. The matrix A is referred herein as a thermal resistance matrix, the matrix B is referred herein the heat source matrix, and the matrix C is referred herein the temperature sensor matrix.

Note that to determine the rank of the thermal management matrix, the locations of matrices A, B, C and zeros in the thermal management matrix are irrelevant.

The aforementioned rank condition is one example of an observability test. The temperature sensor matrix C is designed such that the observability test is satisfied. In some embodiments, constraints are applied to the augmented thermal circuit model to yield accurate estimation of the values of the temperatures and values of the heat losses. In some embodiments, the processor 125 solves the joint estimation problem using one or combination of a Kalman filter, a PD observer, an adaptive observer, an L1 adaptive observer, and a Luenberger observer to estimate the values of the temperatures and values of the heat losses, Thermal Circuit Model The relationship between heat losses and temperatures at each component of a motor may be described by a heat equation. In practice, due to the complicated geometry, the heat equation may be solved with numerical methods such as finite-element simulations. Alternatively, it may be simplified with an equivalent thermal circuit, or a lumped thermal circuit network. A thermal circuit model may be derived from the equivalent thermal circuit. Further, thermal behavior of the electric motor may be described based on the thermal circuit model.

FIG. 3A shows a table exhibiting analogous thermal and electrical quantities. Thermal resistance $R_{th}$ and thermal capacitance $C_{th}$ are determined based on geometry and material properties of the electric motor. The thermal circuit model is derived from the thermal resistances and the thermal capacitances. The thermal capacitance may also be referred to as heat capacity. Herein after, for the ease of representation, thermal resistance $R_{th}$ and thermal capacitance $H_{th}$ are represented by R and H respectively.

Figure 3B:
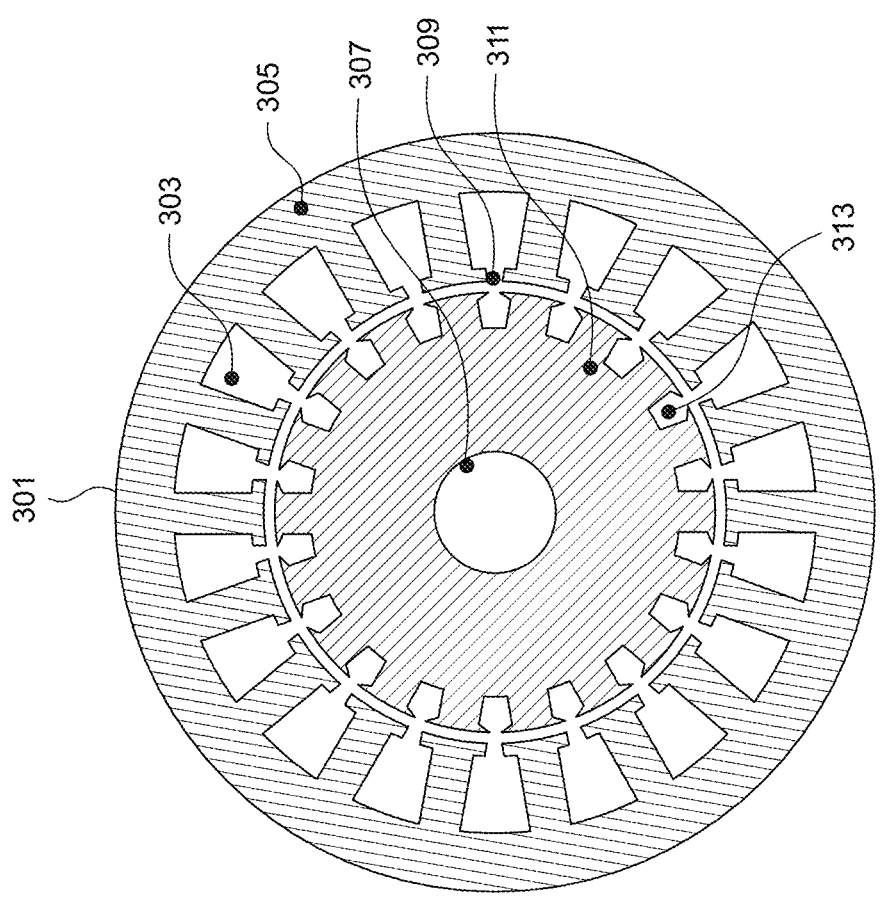
FIG. 3B is an example of cross section geometry of the electric motor with node selection, according to some embodiments.

FIG. 3B is an example of cross section geometry of an electric motor 301 with node selection, according to some embodiments. In the electric motor 301, certain locations are selected for measuring temperatures. The dark dots 303-313 in the FIG. 3B represent locations at various parts of the electric motor 301. The locations may be at any part of the electric motor 301, such as but not limited to stator slot 303, stator laminations 305, shaft 307, air gap 309, rotor laminations 311, and rotor slot 313. The locations selected at various parts of the electric motor 301 may be referred to as nodes. The selection of nodes governs the thermal circuit model. As a result of this, there is a relevancy between electrical components of the thermal circuit model and the nodes of the electric motor.

Figure 3C:
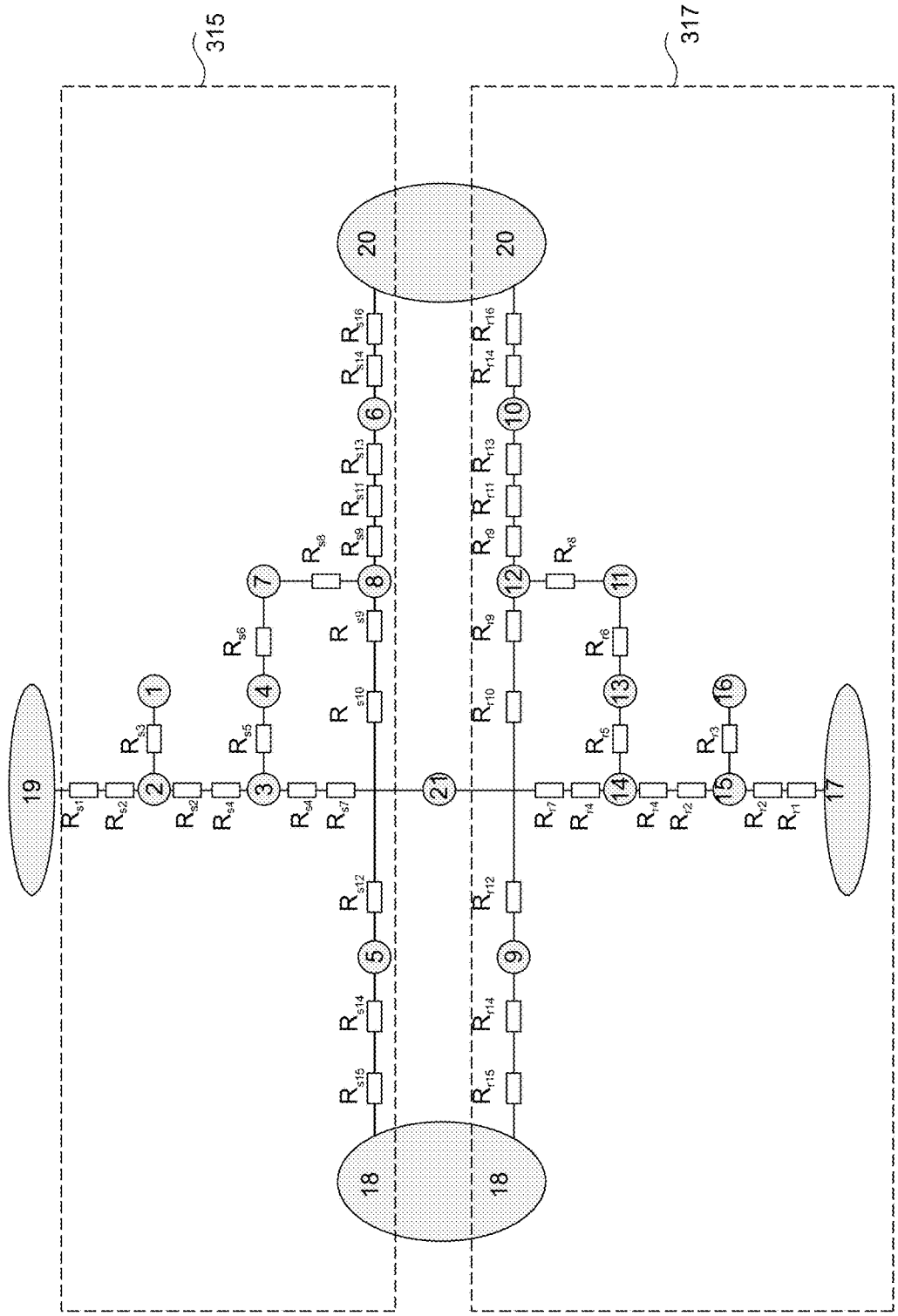
FIG. 3C illustrates an equivalent thermal circuit of an electrical motor used by some embodiments.

FIG. 3C illustrates an equivalent thermal circuit of an electrical motor used by some embodiments. For simplicity, it is assumed that the heat flows solely in stacks in the radial direction because the thermal conductivity in the axial direction is notably lower than in the radial direction. Further, it is reasonable to assume that the heat flows from the slots to the teeth but not directly to the yoke as slots are normally deep and narrow, whereupon the heat flow from a slot to the yoke is small. A node represents a physical location in the motor, wherein the physical location corresponds to locations where the losses of the machine are supplied and/or temperature has to be measured and/or other parts of the motor where the temperature is not measured but should be estimated without direct temperature measurements. In FIG. 3C, the nodes are indicated by a shaded shapes and is associated with a respective node number (1-21) in the shaded circle. The equivalent thermal circuit may include 'n' nodes. For the ease of describing the equivalent thermal circuit instance, 21 nodes are considered.

For example, a stator side equivalent thermal circuit 315 includes nodes 1 to 8, wherein node 1 is at yoke of the stator, node 4 is at tooth of the stator, node 7 is at slot of the stator and nodes 5, 6 are at end winding of the stator. A rotor side equivalent thermal circuit 317 consists of nodes 9 to 17, wherein nodes 9, 10 are at end winding of the rotor, node 11 is at slot of the rotor, node 13 is at tooth of the rotor, node 16 is at yoke of the stator and node 17 is at shaft. The nodes 18 and 20 are at the end winding space. The node 19 is at a location of a frame of the electric motor. The node 21 is at the air-gap of the electric motor.

The thermal resistance R is a measure of temperature difference by which an object or material resists a heat flow. Similar to Ohm's law, an ideal thermal resistor is defined as $$R = \Delta T/Q.$$

According to Fourier's law of heat conduction, the thermal resistance R may be calculated as $$R = l/\kappa A,$$

where $l$ is the length of the material, $\kappa$ is the thermal conductivity of the material, and A is the cross-sectional area.

The thermal capacitance is analogous to the electrical capacitance as shown below. The electric charge Q stored in a capacitor is given by $$Q = C_c V_c$$

where $C_c$ is the capacitance of the capacitor and $V_v$ the voltage across the capacitor. The thermal capacitance of an object is a measure of the ability to store heat. The thermal capacitance is calculated as $$H = C_p m = C_p \rho V_1,$$

where $C_p$ is specific heat, m is the mass, $\rho$ is the density of the material, and $V_1$ is the volume.

In addition, the heat flow, equivalent to the current flow in an electric circuit, is provided by the heat losses in the electric motor. A constant temperature condition is commonly used to describe the boundary conditions of the electric motor with a constant ambient or coolant temperature.

For a given motor design with geometrical and material parameters, the components in the electric motor may be described by thermal circuit elements. By connecting the elements together, a thermal circuit network may be constructed. In FIG. 3C, the equivalent thermal circuit is constructed with lumped thermal resistors, thermal capacitors, and the thermal losses. To solve for the thermal circuit model, Kirchhoff's current law is applied to each node of the thermal circuit network:

$$H_i \dot{T}_i(t) = -\sum_j \frac{T_i(t)}{R_{ij}} + \sum_j \frac{T_j(t)}{R_{ij}} + P_i(t)$$

where:
$H_i$ is the thermal capacitance connected to the node,
$R_{ij}$ is the thermal resistance between nodes i and j,
$P_i$ is the heat source connected to the node I,
The summation is over j for neighboring nodes.

The dynamics of the equivalent thermal circuit, referred to as thermal dynamics in this disclosure, may be rewritten in a matrix form as:

$$H\dot{T}(t) = AT(t) + Bu(t) + Vv,$$

where:
H: matrix determined by thermal capacitances in the circuit model. dim[H(·)]=n×n, T(t): vector representing temperature at all nodes at time t. $T(t) \in R^n$, A: matrix determined by thermal resistances in the circuit model. $\dim[A(\cdot)]=n \times n$, u(t): input vector representing the heat losses. $u(t) \in R^p$. p is the number of heat losses in the circuit model, B: input matrix representing the location of the heat losses. $\dim[B(\cdot)]=n \times p$, In addition, the contributions from constant-temperature boundaries may be separated, v: a vector representing constant-temperature boundaries. $v \in R^q$, q is the number of boundaries, V: a matrix representing the location of the constant temperature boundaries. $\dim[B(\cdot)]=n \times q$.

Multiplied by the inverse of H matrix, the equation system may be reformulated into a state-space representation for the system:

$$\dot{T}(t) = A_2 T(t) + B_2 u(t) + V_2 v,$$

where $A_2 = H^{-1}A$. $B_2 = H^{-1}B$ and $V_2 = H^{-1}V$.

Thermal Circuit Model Calibration

The thermal circuit model formulated above is very abstract and incompatible for joint estimation. The parameters of the thermal circuit model such as the thermal resistance and the thermal capacitance values need to be calibrated to better describe the thermal behavior of the electric motor. The thermal circuit model calibration may be achieved from experiments, or high-accuracy simulation models such as finite-element models (FEM), or a combination of both.

Figure 4A:
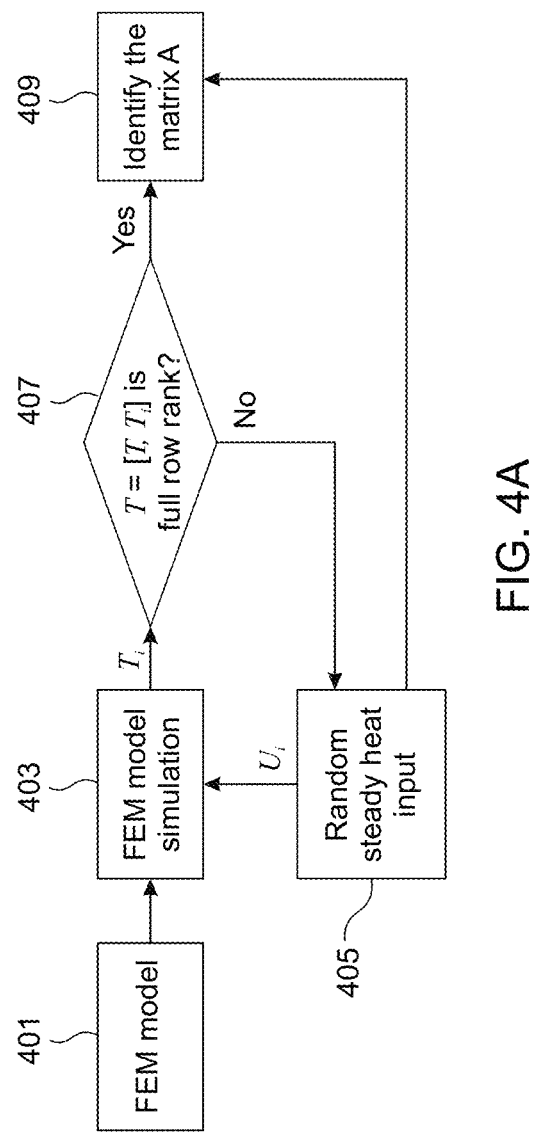
FIG. 4A shows a schematic of calibration of a matrix A representing thermal resistances in the thermal circuit model, according to an embodiment.

FIG. 4A shows a schematic of calibration of matrix A representing thermal resistances in the thermal circuit model according to an embodiment. The matrix A is calibrated by utilizing simulation data generated from a high fidelity finite element model (FEM). An FEM model 401 is formulated and subsequently the FEM model simulation 303 is carried out with certain random heat loss inputs $U_i$, $U_i \in R^n$ (n is the number of nodes considered in the thermal circuit model). The heat loss inputs $U_i$ is assumed to be constant. Therefore, the heat loss input $U_i$ is referred to as steady heat input $U_i$. The FEM model simulation 403 outputs temperatures at various locations corresponding to the state of the thermal dynamics, which may be denoted as $T_i$, $T_i \in R^n$. Numerating through N linearly independent inputs $U_i$, $1 \leq i \leq N$ which implies $U=[U_1, \ldots, U_N]$, the FEM model simulation 403 outputs a set of temperatures $T_i$, $1 \leq i \leq N$ which implies $T=[T_1, \ldots, T_N]$. The set T is checked for a full row rank 407. If the set T is not a full row rank, then another random steady heat losses 405 is applied to the FEM model simulation 303. If T is a full row rank, then matrix A is identified 409.

Since each heat loss input $U_i$ is assumed to be constant, time derivatives of temperatures are equal to zero, as a result, the following equation may be derived:

$$AT+BU=e$$

where e denotes measurement noises and B is the heat source matrix that describes how the heat loss distributes inside a motor. The matrix B can be modeled from the first principle (for example, copper loss occurs at wounding and iron loss happens at core regions) and is hence assumed to be known, i.e, determined in advance. The above equation is utilized to identify the matrix A 309 by solving least square problem, which gives a solution:

$$A=-BUT^T(TT^T)^{-1}$$

Figure 4B:
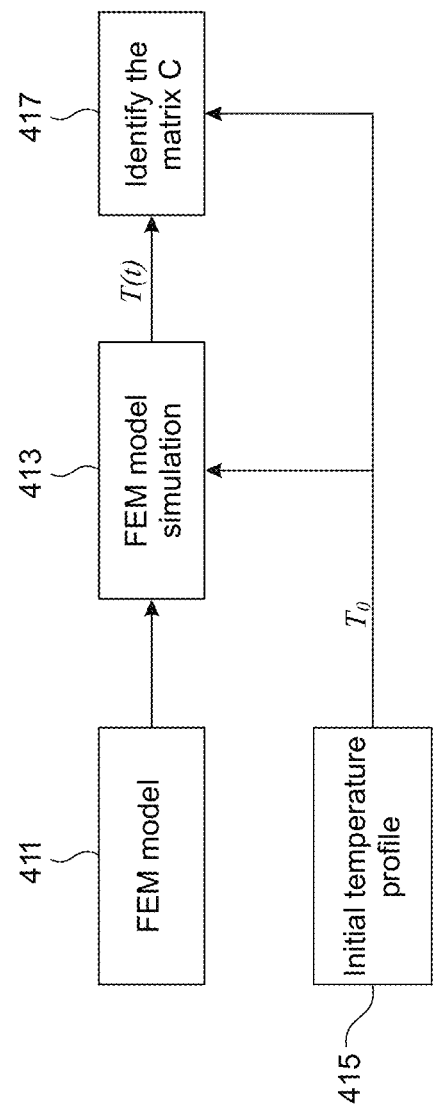
FIG. 4B shows a schematic of calibration of a matrix C in the thermal circuit model, according to an embodiment.

FIG. 4B shows a schematic of matrix C determination in the thermal circuit model, according to an embodiment. The heat loss inputs applied to the electric motor are removed, so that $u(t)=0$ for $t>0$. A FEM model simulation 413, based on a FEM model 411, is initiated with an initial temperature distribution 415 $T_0$ at time $t=0$. The FEM model simulation 413 yields temperature $T(t)$. Temperatures $T_m(t)$ are measured at different times $t=t_1, t_2, t_3, \ldots t_n$ until the changes in temperature between two measurements is small, and steady state temperature distribution is reached.

The temperature distribution may be calculated analytically $$T(t)=T_{SS}+\exp(C^{-1}At)(T_0 T_{SS})$$

where $T_0$ is the initial temperature distribution $T(0)$, and $T_{SS}$ is the steady-state temperature distribution, and $T_{SS}=-A^{-1}Dv$.

By comparing the measured temperatures with theoretical values, the elements in matrix C may then be adjusted to minimize the difference between $T(t)$ and $Tm(t)$.

However, in addition to the matrix A and matrix C, the heat source u determines the thermal behavior of the electric motor. Since it is difficult to model the heat source u accurately, the temperature measurements and design estimators or observers are utilized to identify heat source u. Prior to determining the model of the heat source u, optimal locations of temperature sensors are determined.

Figure 5A:
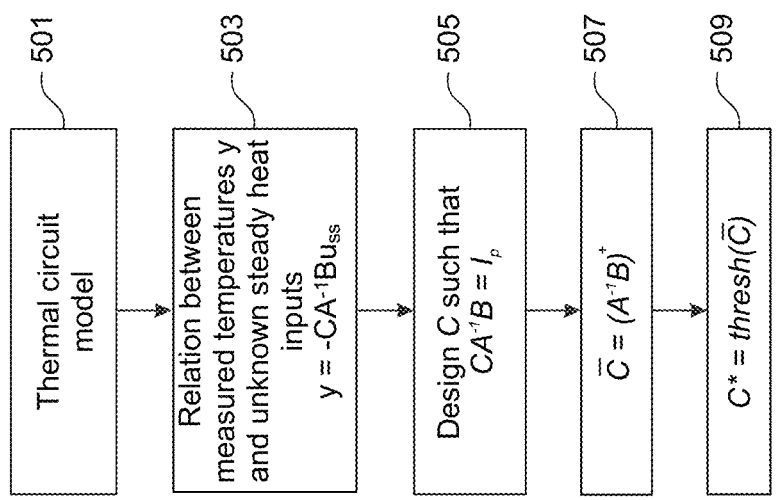
FIG. 5A shows a schematic of identifying temperature sensor locations in the electric motor by solving a least square problem, according to some embodiments.

FIG. 5A shows a schematic of identifying temperature sensors locations in the electric motor by solving a least square problem, according to some embodiments. The temperature sensor locations are represented by the matrix C in the thermal dynamics. At this stage, the temperature sensors are utilized to measure temperatures y such that the unknown heat losses and temperature at other locations of the electric motor that do not have direct temperature measurements may be inferred from y. From the thermal dynamics, the measured temperatures y with unknown steady heat inputs 503 are given by $$y=-CA^{-1}Bu_{ss}$$

where $u_{ss}$ is the unknown steady heat loss input. In order to infer $u_{ss}$ from y in a reliable manner, ideally the matrix $CA^{-1}B$ corresponds to an identity matrix. This is unlikely; however the temperature sensor locations i.e. elements of C matrix may be selected such that $CA^{-1}B$ is as close to the identity matrix as possible which implies $CA^{-1}B=I$ 505. This may be achieved by solving the following linear equation $$CA^{-1}B=I$$

A least square solution is applied to obtain solution 507 yields:

$$\acute{C}=(A^{-1}B)^{+}$$

where superscript + denotes pseudo-inverse. The determined matrix $\acute{C}$ contains elements which are continuous. In some embodiments, the determined matrix $\acute{C}$ contains absolute values i.e. either 0 or 1. However, in practice only elements either 0 or 1 have to be there in the determined matrix $\acute{C}$ to determine locations of the temperature sensors.

Figure 5B:
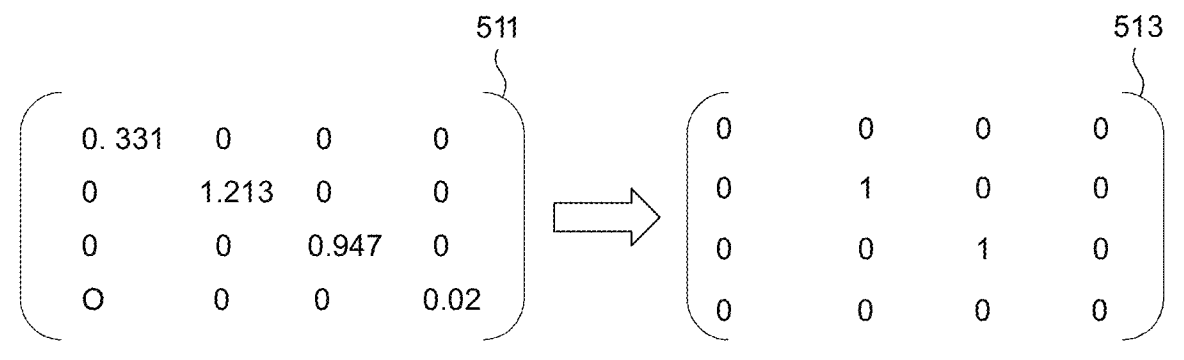

FIG. 5B shows transformation of an example matrix $\acute{C}$ containing continuous elements into matrix C* containing absolute values according to some embodiments. Consider a 4*4 matrix representing a matrix $\acute{C}$. As the matrix $\acute{C}$ contains continuous elements, a threshold function is applied on the matrix $\acute{C}$ 411 to obtain matrix C* which contains the absolute values 413. For instance, the element 0.331 is transformed to 0, for example by rounding-off the element to the nearest integer. Each element of matrix C corresponds to a location of a node of the motor. The element 1 signifies that a temperature sensor is placed at a particular location and element 0 signifies that no sensor is placed at a particular location. In some embodiments, the element 1 signifies temperature is measured at a particular location and element 0 signifies that temperature is not measured at a particular location. In this way, by transforming the elements of the matrix $\hat{C}$ the matrix $C^*$ is obtained by applying a threshold function 509 (for example the rounding off).

Figure 5C:
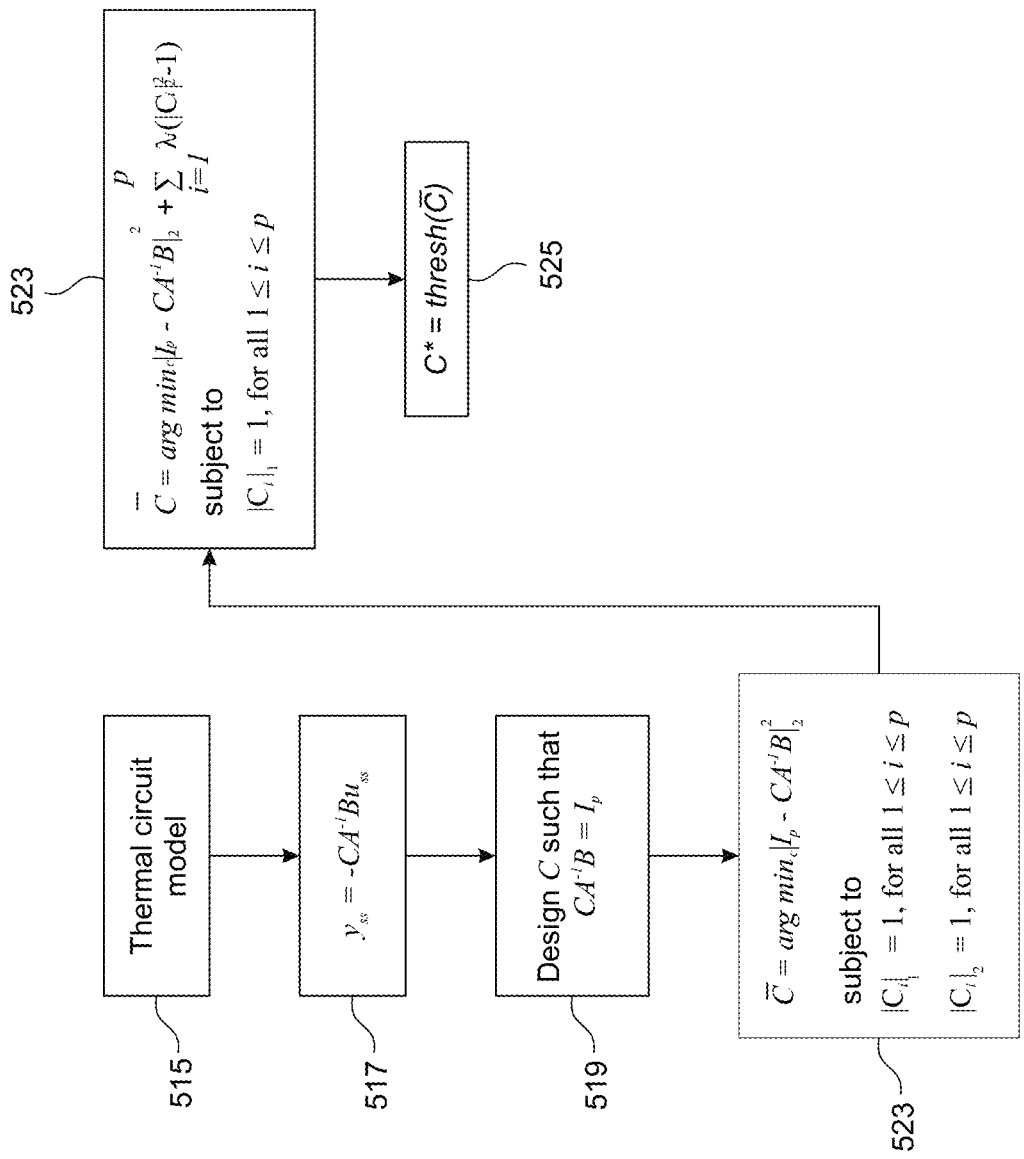
FIG. 5C shows a schematic of identifying temperature sensor locations in the electric motor by solving an optimization problem, according to an embodiment.

FIG. 5C shows a schematic of identifying temperature sensor locations in the electric motor by solving an optimization problem, according to an embodiment.

Similar to FIG. 5A, the locations are determined by solving the linear equation $$CA^{-1}B = I$$

In one implementation, in order to make sure the solved C matrix, denoted by $\hat{C}$, contains only elements 1 or 0, and particularly, to make sure that there is only one non-zero element in each row of $\hat{C}$, the following constraints 515 should be satisfied:

$$|C_i|_1 = 1, \text{ for all } 1 \le i \le p$$

$$|C_i|_2 = 1, \text{ for all } 1 \le i \le p$$

where $C_i$ represents the $i^{th}$ row of C, and $\cdot|_p$ denotes the p-norm of a vector. As a result, the temperature sensor location may be selected by solving the following optimization problem 515:

$$\hat{C} = \text{argmin}_C |I - CA^{-1}B|_2^2 \text{ subject} |C_i|_1 = 1,$$
$$\text{for all } 1 \le i \le p |C_i|_2 = 1, \text{ for all } 1 \le i \le p$$

The aforementioned problem is non-convex, due to the existence of quadratic equality constraints. The non-convex optimization problem may be relaxed to a convex optimization problem by incorporating the non-convex equality constraint into cost function. The relaxation yields the following optimization 517:

$$\hat{C} = \text{argmin}_C |I - CA^{-1}B|_2^2 + \sum_{i=1}^{p} \lambda_i (|C_i|_2^2 - 1)$$

$$\text{subject } |C_i|_1 = 1, \text{ for all } 1 \le i \le p$$

where $\lambda_i$ is a weight.

The determined matrix $\hat{C}$ contains elements which are continuous. As described above, the threshold function is applied on the determined matrix $\hat{C}$ to obtain matrix $C^*$ 519 which contains the absolute values either 0 or 1.

Accordingly, the first subset of nodes is selected such that a product of a temperature sensor matrix, an inverse of a thermal resistance matrix and heat source matrix approximates an identity matrix. In this context, "approximate" means that the found solution is the closest binary with zero and one values solution for matrix C.

In this way, the matrix A and matrix C are determined by some embodiments. Optionally, a heat source as a function of operating points of the electrical motor is determined. The operating points may include voltage V, current I and speed or frequency $\omega$. A plurality of heat sources are determined for different operating points. The heat input database is established by mapping the determined heat sources with the corresponding operating points.

Figure 6:
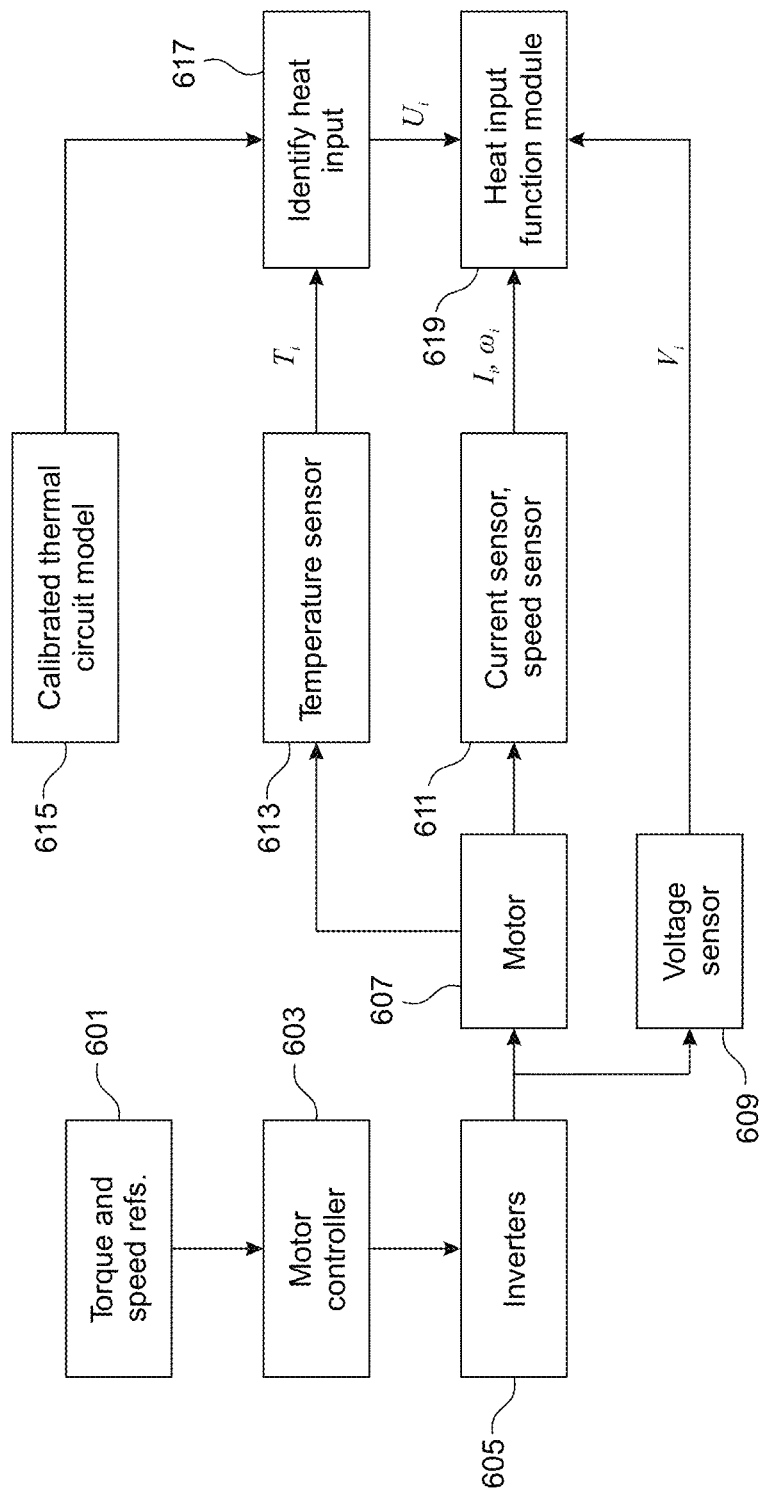
FIG. 6 shows a schematic of determining heat source as a function of operating points [I, V, ω], according to some embodiments.

FIG. 6 shows a schematic of determining heat source U as a function of operating points [I, V, $\omega$] according to some embodiments. Consider a motor 607 applied with a suitable power source to run the motor 607 at a certain speed. The motor 607 is associated with a motor controller 603 which generates control commands based on the torque and speed references 601. An inverter 605 generates voltage for the motor 607 based on the generated control commands. The motor 607 includes a voltage sensor 609, current and speed sensor 611, and a temperature sensor 613. The voltage sensor 609 senses and produces voltage signal $V_i$ based on voltage across the motor 607 and subsequently sends the voltage signal to a heat input calibration module 619. The current and speed sensor 611 generates current and speed signal $I_i$, $\omega_i$ based on the current through the motor 607 and speed of rotor of the motor 607. Subsequently, the current and speed signal are sent to the heat source calibration module 619. The temperature sensors 613 produce temperature signals $T_i$ based on temperatures at locations of the temperature sensors 613. The produced temperature signals are utilized to identify heat source 617 based on the calibrated thermal circuit model 615. The identified heat source $U_i$ fed into the heat source calibration module 619. The output of the heat source calibration module 619 is a smooth function with its arguments being current, voltage, and speed i.e. $U_i = \Theta[V_i, I_i, \omega_i]$.

In some embodiments, the smooth function may take a deterministic form, such as polynomial, and be written as:

$$u(I, V, \omega) = \sum_{i=1}^{N} w_i \phi_i(I, V, \omega)$$

where $w_i$ is a constant weight to be determined through calibration, and $\phi_i(I, V, \omega)$ is a polynomial function of current I, voltage V, and speed $\omega$. Given the function $\phi_i(I, V, \omega)$, the heat source calibration module 619 determines $w_i$ to minimize the error between identified heat source and the predicted heat source according to the model, by solving $$\hat{w}_i = \text{argmin}_{w_i} \left| u_{ss} - \sum_{i=1}^{N} w_i \phi_i(I, V, \omega) \right|_2^2$$

where $u_{ss}$ denotes the identified heat source.

Different heat sources are determined for corresponding different operating points. Further, the heat source calibration module 619 establishes the heat source mapping database and may be utilized for an initial estimation of real-time estimator to identify heat source in real time.

Figure 7:
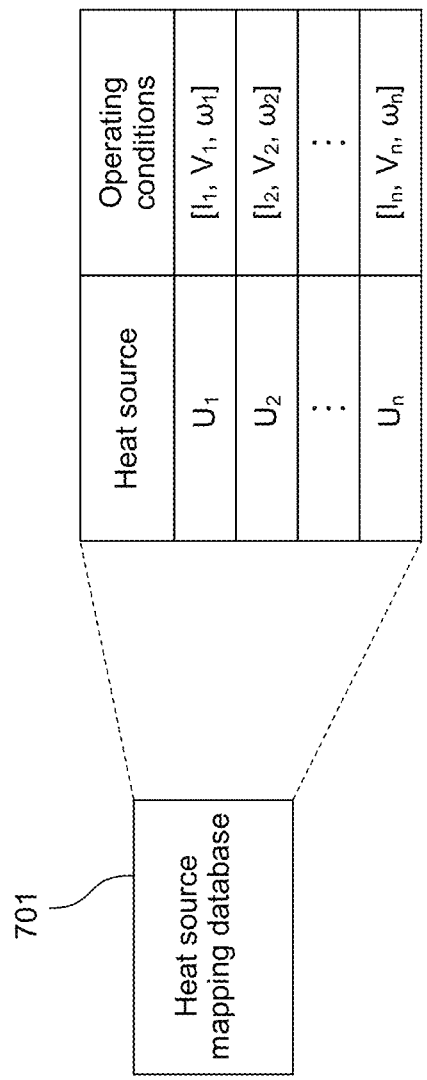
FIG. 7 shows a heat source mapping database for an initial estimation of real-time estimator to identify heat source in the electric motor in real time, in accordance with an embodiment.

FIG. 7 shows a heat source mapping database for the initial estimation of real-time estimator to identify heat source in real time, in accordance with an embodiment. A heat source mapping database 701 comprises a mapping of the determined heat losses $U_1, U_2, \ldots U_n$ with the respective operating conditions $[I_1, V_1, W_1], [I_2, V_2, W_2], \ldots [I_n, V_n, W_n]$. In some embodiments, the heat source mapping database 701 may be stored in the memory 133 of the system 100. In some embodiments, the heat source data may be stored in an external memory and may be accessed via a network or interface. In some implementations, the heat source mapping database 701 is utilized for an initial estimation of real-time estimator/observer to identify u in real time, where the operating points may be changing with time. The heat loss estimation is done in real time because offline determination of the heat loss is inaccurate. The heat sources are a function of time and depend on operating points of the electric motor which are time varying and on time varying physics of temperature distribution. By estimating the values of the heat losses in real time, the estimated values are based on the real-time operating points of the electric motor, thereby increasing the accuracy of the heat losses estimation.

Figure 8:
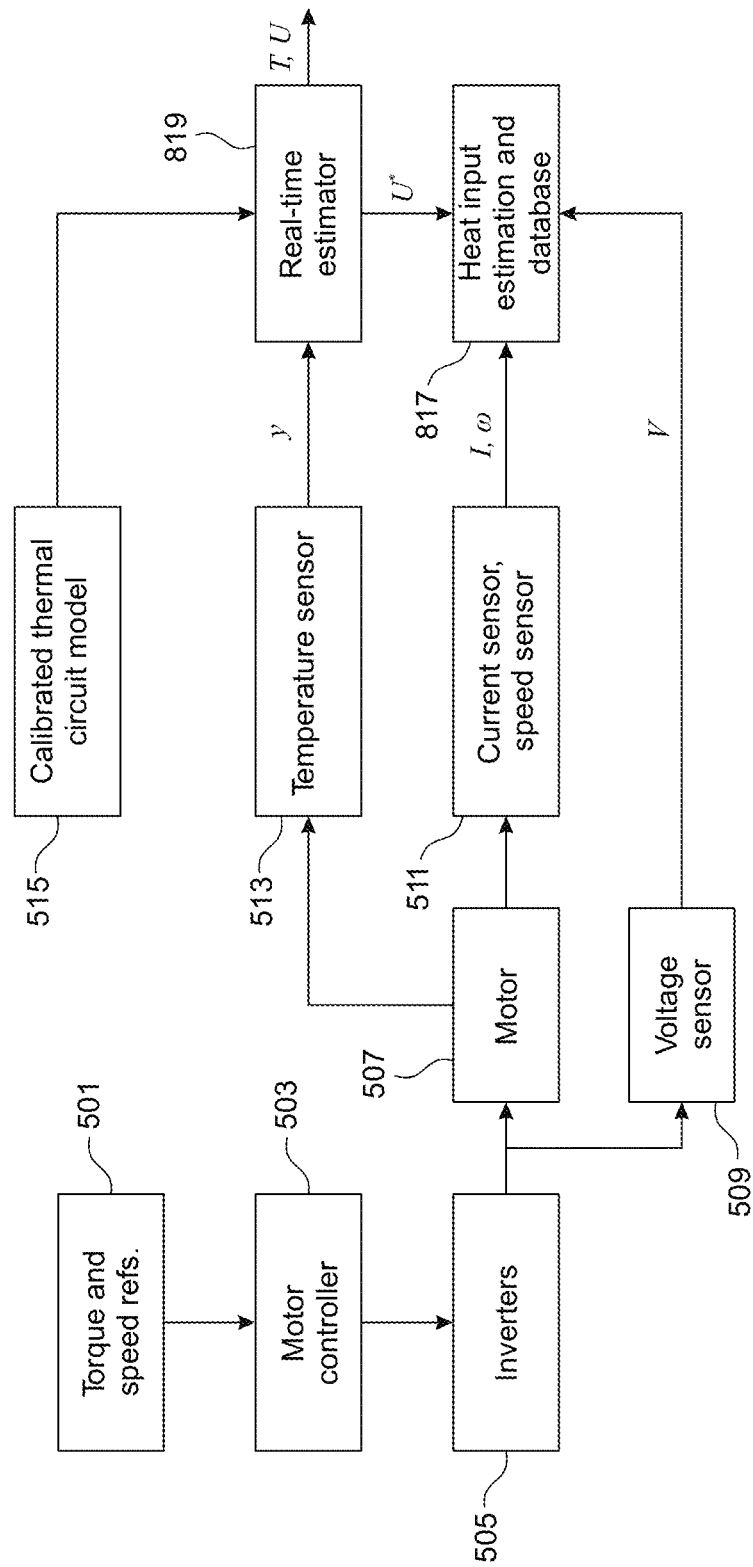
FIG. 8 shows a schematic of operation of a real-time estimator to jointly estimate temperature and heat losses, according to some embodiments.

FIG. 8 shows a schematic of operation of a real-time estimator to identify temperature and heat losses simultaneously, according to some embodiments.

As described with reference to FIG. 6, during the motor running condition, the voltage sensor 609, the current and speed sensor 611 provide operating conditions [I, V, ω] of the motor 607 respectively. The operating conditions are fed to the heat source estimation and database 817. The temperature sensor 613, whose locations are determined by the process described earlier, determines temperatures at locations of the temperature sensors and sends to the real-time estimator 819. An initial estimation of heat source u*(I, V, ω), based on the heat source mapping database, is fed to the real-time estimator 819. The real-time estimator 703 determines temperature T and heat losses u based on the calibrated thermal circuit model 615, temperatures measured y and the initial estimation of heat source u*(I, V, ω).

Exemplar Implementation

Figure 9:
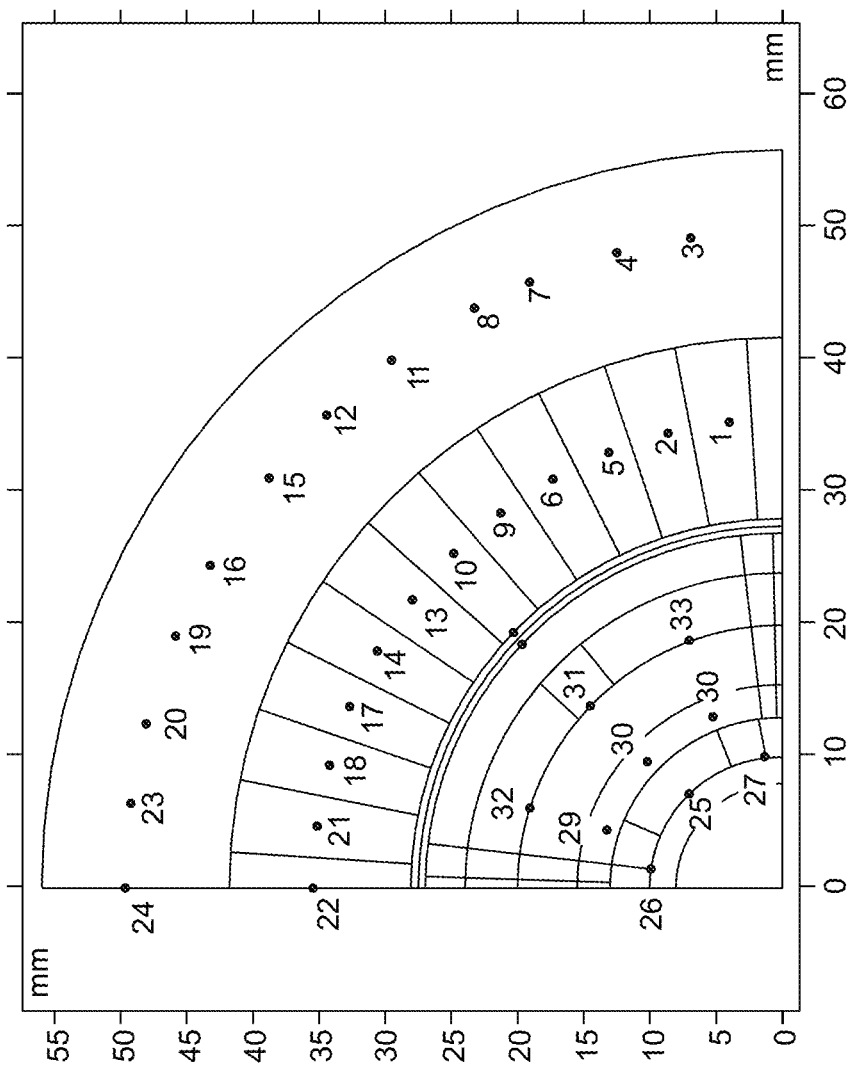
FIG. 9 illustrates a quarter cross-section of an electric motor for exemplar implementation used by some embodiments.

FIG. 9 illustrates a quarter cross-section of an electric motor for exemplar implementation of some embodiments. For ease of description, the electric motor is considered to have 33 nodes. The nodes, numbered 1 through 33, represent spatial locations at which the temperature is of interest. These locations ay correspond to critical areas of the motor where the temperature is expected to be within a predetermined range. By incorporating thermodynamics with nodes, a thermal circuit network may be derived, where the temperature of each node, thermal flow between nodes, thermal conductivity, and thermal capacity are analogous to voltage, current, resistance, and capacitance of an electrical circuit network, respectively. Hence, the thermal circuit network induces dynamics of temperature at these locations, which may be fully described by the thermal circuit model:

$$\dot{T}(t) = AT(t) + Bu(t) + Vv$$

$$y_n(t) = CT(t) + n(t) \quad (1)$$

where:
$T \in R^n$ is the system state vector (not measurable in its entirety),
A is constant state matrix,
$B \in R^{n \times m}$ is the input matrix containing information of heat source distribution,
the term $Vv$ defines the boundary condition, $V \in R^{n \times q}$, $v \in v^{q \times 1}$,
$C \in R^{p \times n}$ is the output matrix containing information of sensors' size and location, C is determined in advance,
$u(t) \in R^m$ is the system input, and
$y_n \in R^p$ is the system measured output, which is corrupted by measurement noise $n(t) \in R^p$.

System matrices A, B, V, C of appropriate dimensions are calibrated and incorporated in the thermal circuit model (1) to yield a calibrated thermal circuit model.

In some example embodiments, the thermal circuit model or the calibrated thermal circuit model of the electric motor is combined with an estimator/observer. Thereafter, using the estimator/observer designed in the manner described above and temperature measurements at a limited number of locations, the heat losses and the temperatures are estimated simultaneously. The simultaneous estimation of the heat losses and the temperature is referred to as joint estimation. The values of the heat losses and the temperature are interdependent. This signifies that any change in the heat losses affects the temperatures and vice versa. The joint estimation is also called online inverse heat transfer.

In this exemplar thermal circuit model, there are four types of heat losses, $u_1$ is stator iron loss, $u_2$ is stator copper loss, $u_3$ is rotor copper loss, and $u_4$ is magnet loss. The heat losses $u_1$, $u_2$, $u_3$, and $u_4$ are unknown heat sources/losses. The heat sources $u_1$, $u_2$, $u_3$, and $u_4$ are to be estimated online. Further, locations of $u_1$, $u_2$, $u_3$, and $u_4$ correspond to second subset of locations. $u_1$ is evenly distributed at nodes (1,5,9, 13,17,21); $u_2$ is evenly distributed at nodes (2,6,10,14,18, 22); $u_3$ is evenly distributed at nodes (25,26,27,31); and $u_4$ is evenly distributed at nodes (28,29,30).

To achieve the joint estimation without constraints, number of temperature sensors and number of the unknown heat sources should be same. Further, for higher estimation accuracy, at least one temperature sensor should be placed nearby each unknown heat source. However, it is desired to avoid attaching the temperature sensors in the rotating parts due to technical difficulty and economic cost. Estimating the temperature and the heat loss distribution in the electric motor only locations at stationary parts of the electrical motor results an ill-conditioned joint estimation problem. Therefore, certain constraints that may ease the online inverse heat transfer problem are applied. In some embodiments, the constraints transforming the ill-conditioned joint estimation problem into the well-condition joint estimation problem include one or combination of an increased number of temperature measurements and initial values of the heat losses in the second subset of locations. Initial values of the heat losses can be chosen from a given operation condition specified by current, voltage, and speed i.e. $U_i = \Theta[V_i, I_i, \omega_i]$ described in the captions of FIG. 6 and FIG. 7. In some embodiments, assumption that total heat source may be identified by measuring input electric power and output torque is considered as the constraint. Another suitable constraint is stator winding loss, which may be measured by current and temperature sensors.

Introducing constraints can transform ill-conditioned joint estimation problem into the well-conditioned joint estimation problem. One of the constraints is the total value of heat losses during the operation of the electric motor. One can also experimentally determine a few heat loss values by measuring the currents, voltages, and magnetic fields. Even for an already well-conditioned problem, introducing constraints can enhance numerical stability. Some embodiments provide an example how the constraint is implemented in the algorithm, however, this method can be easily generalized to other types of constraints.

The total heat losses constraint is formulated as below $$u_1(t) = c_1 + 3\alpha T_1(t) I^2(t) R$$

$$\sum_{i=1}^{p} u_i(t) = c_2 + 3\alpha T_1(t) I^2(t) R \quad (2)$$

where $T_1(t)$ is the temperature of state field winding,
$\alpha$ is the temperature coefficient of copper resistance,
$I(t)$ is current, and
$c_1$ and $c_2$ are all known constants.

Applying the constraints of Eqn. (2) into the thermal circuit model defined in Eqn. (1), a modified thermal circuit model is derived as below:

$$\dot{T}(t) = AT(t) + B(:,1)u_1(t) + Vv + \quad (3)$$
$$(c_2 - 6c_1)B(:,4) + [B(:,2) - 6B(:,4)B(:,3)B(:,4)]\begin{bmatrix} u_2(t) \\ u_3(t) \end{bmatrix}$$

$$y_n(t) = y(t) + n(t)$$

After adding constraints, there are only two unknown heat losses in Eqn. (3), $u_2$ and $u_3$.

For simplicity, denote $$B_m = [B(:,2) - 6B(:,4)B(:,3)B(:,4)]$$

In an example embodiment, the heat loss, although fast-changing, may be treated as a slow-varying input, because the thermal dynamics change much slower than u(t), and the effect of u(t) on the temperature will be averaged. In other words, the effect of a fast changing u(t) on the temperature is analogous to a slow changing u(t). In another example embodiment, u(t) may be viewed as a constant parameter, and since u(t) are unknown inputs, they may be taken as state variables. Hence, an augmented state-space model is established based on Eqn. (1) as below $$\begin{bmatrix} \dot{T}(t) \\ \dot{u}(t) \end{bmatrix} = A_e \begin{bmatrix} T(t) \\ u(t) \end{bmatrix} + V_e v \quad (4)$$

$$y_n(t) = C_e \begin{bmatrix} T(t) \\ [u(t)] \end{bmatrix} + n(t)$$

where:

$$A_e = \begin{bmatrix} AB \\ 0_{m \times n} 0_{m \times m} \end{bmatrix}, V_e = \begin{bmatrix} V \\ m_{m \times q} \end{bmatrix}$$

$$C_e = [C 0_{p \times m}]$$

$$Denote C_o = \begin{bmatrix} A_e \\ C_e \end{bmatrix}$$

For the augmented thermal circuit model, the matrix $C_0$ is not Hurwitz (stable) because the eigenvalues corresponding to the u(t) are zero, and thus unstable. Further, the augmented thermal circuit model may fail the observability test. As a result of this, applying Kalman filter with certain temperature measurement matrix C may yield unreliable temperature estimation.

Figure 10:
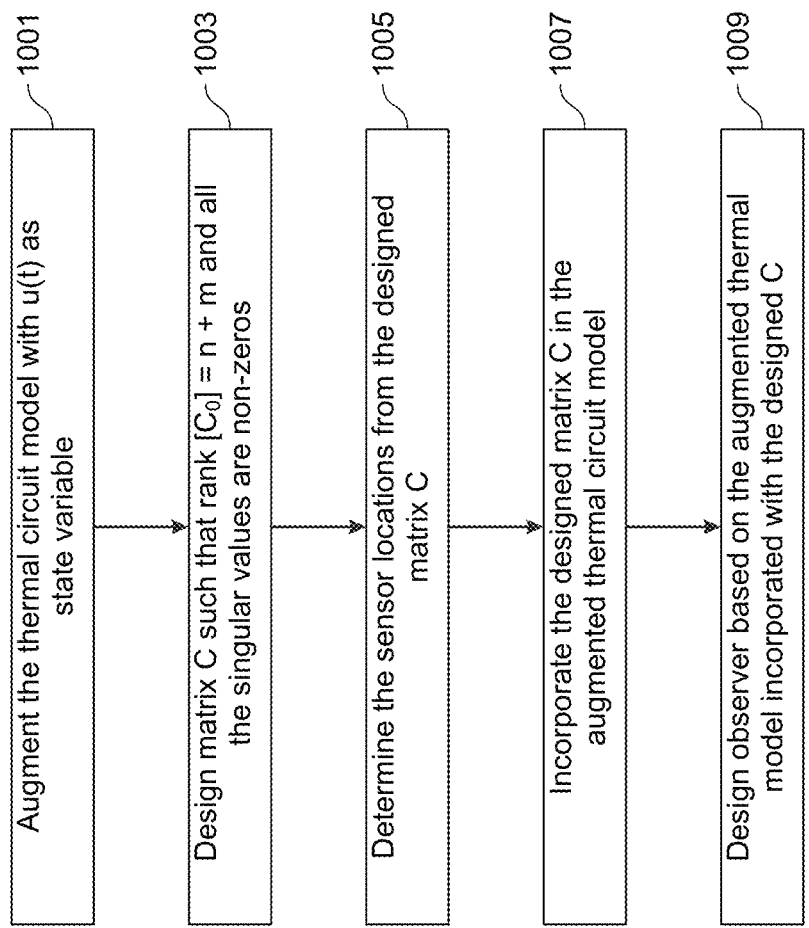
FIG. 10 is a schematic of stabilizing the augmented circuit model to achieve the joint estimation, according to some embodiments.

FIG. 10 is a schematic of stabilizing the augmented circuit model to achieve joint estimation according to some embodiments. Consider the thermal circuit model defined in Eqn (1) is augmented with u(t) as state variable 1001. To make the Eqn (4) stable, the design of matrix C should satisfy the observability and/or detectability requirement. Further, matrix C needs to be determined before the observer design as the matrix C contains the information of number and location of the temperature sensors.

The matrix C is designed such that rank $(C_o)$=n+m and all the singular values are non-zeros 1003, wherein n corresponds to the number of temperature nodes in the thermal circuit model and m corresponds to number of unknown inputs i.e. number of heat sources. The unknown values of heat sources correspond to the second subset of locations where heat losses are to be estimated. If rank $(C_o)$=n+m is satisfied, then the observer works well with the designed matrix C. In some embodiments, where the condition rank $(C_o)$=n+m is satisfied, if there exist some singular values equal to zero or are almost zeros, it may indicate that there exist some nodes in the system that are difficult to be detected. In such cases, it is time-consuming to tune an observer for higher estimation accuracy. As the designed matrix C contains the information of size and location of the temperature sensors, the temperature sensor locations are determined 907 from the designed matrix C. Therefore, in addition to stabilizing the augmented thermal circuit model, the temperature sensor placements are also determined. The designed matrix C that satisfies the rank $(C_o)$=n+m is incorporated into the augmented thermal circuit model defined in Eqn (4) 907. Further, different observers are designed based on the augmented thermal circuit model incorporated with the designed matrix C 909.

Consider the modified thermal circuit model defined in Eqn (3). In Eqn (3) $u_1(t)$ is time-varying, random measurement noise between $-1°$ C. and $1°$ C. are added. Since $u_2$ and $u_3$ are unknown inputs, they may be taken as state variables. The extended state-space model is established as in Eqn. (3). However, the established extended state-space model is unstable because the eigenvalues corresponding to the u(t) are zero.

Figure 11:
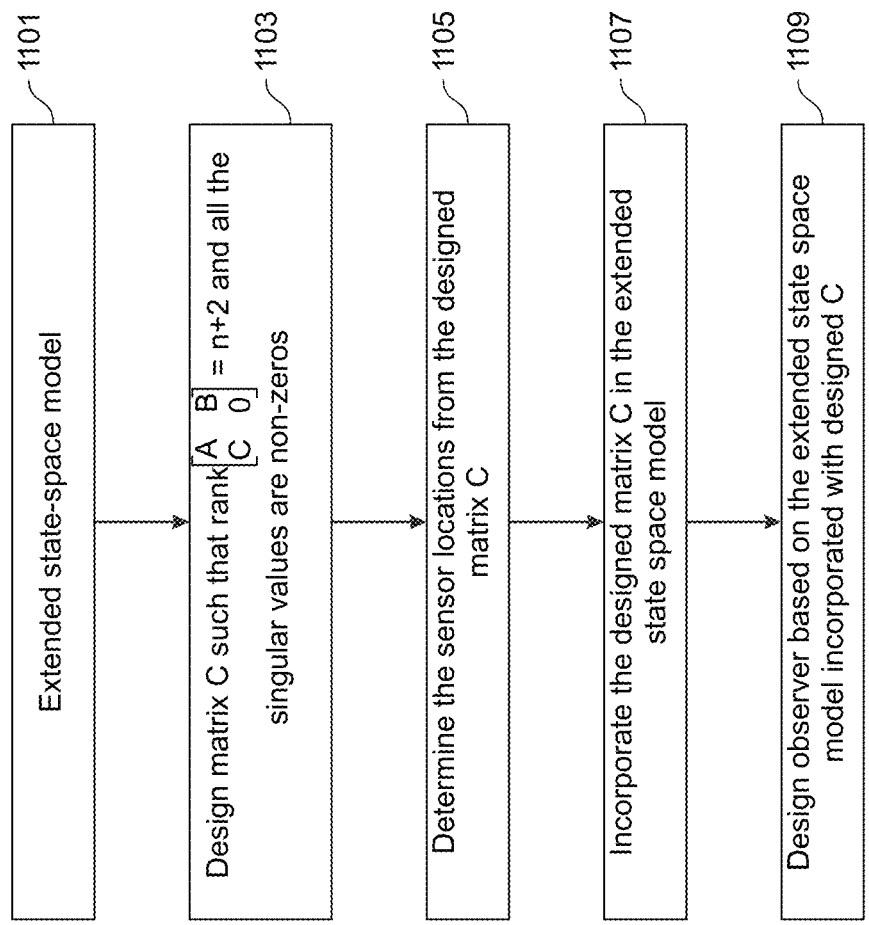
FIG. 11 shows a schematic of stabilizing the extended state-space model to achieve the joint estimation, according to some embodiments.

FIG. 11 illustrates a schematic to stabilize the extended state-space model to achieve the joint estimation according to some embodiments. Consider extended state-space model 1101 with $u_2$ and $u_3$ considered as state variables. Design the output matrix C such that rank of $$\begin{bmatrix} AB \\ C0 \end{bmatrix} = n + 2,$$

and all me singular values are non-zeros 1103. If rank $$\begin{bmatrix} AB \\ C0 \end{bmatrix} = n + 2$$

is satisfied then the observer will work well with the designed matrix C. As the designed matrix C contains the information of size and location of the temperature sensors, the sensor locations are determined 1105 from the designed matrix C. Therefore, beside stabilizing the extended state-space model, the temperature sensors locations are also determined. The designed matrix C that satisfies the $$\begin{bmatrix} AB \\ C0 \end{bmatrix} = n + 2$$

is incorporated into the extended state space model 1107. Further, the different observers are designed based on the modified thermal model defined in Eqn. (4) 1107.

Observer Design

Different observers are designed for solving the online inverse heat transfer problem in the presence of measurement noise. The joint estimation of the unknown heat losses and the temperature is enabled by using different observers. The different observers are designed based on Eqn. (1), hence, they may be applied for solving general online inverse problems for linear time-invariant (LTI) systems. The different observers may include Kalman filter, Luenberger observer, adaptive observer, PD observer and L1 Adaptive observer. A detailed description of each such observer is described next.

In various embodiments, the observers are adapted for joint estimation. Hence, the observers formulate the estimation problem in the augmented circuit model using thermal management matrix, select the temperature sensors on the first subset of nodes, and iteratively estimate the values of the temperatures at the entire set of nodes and the values of the heat losses in the second subset of nodes.

Kalman Filter

Figure 12A:
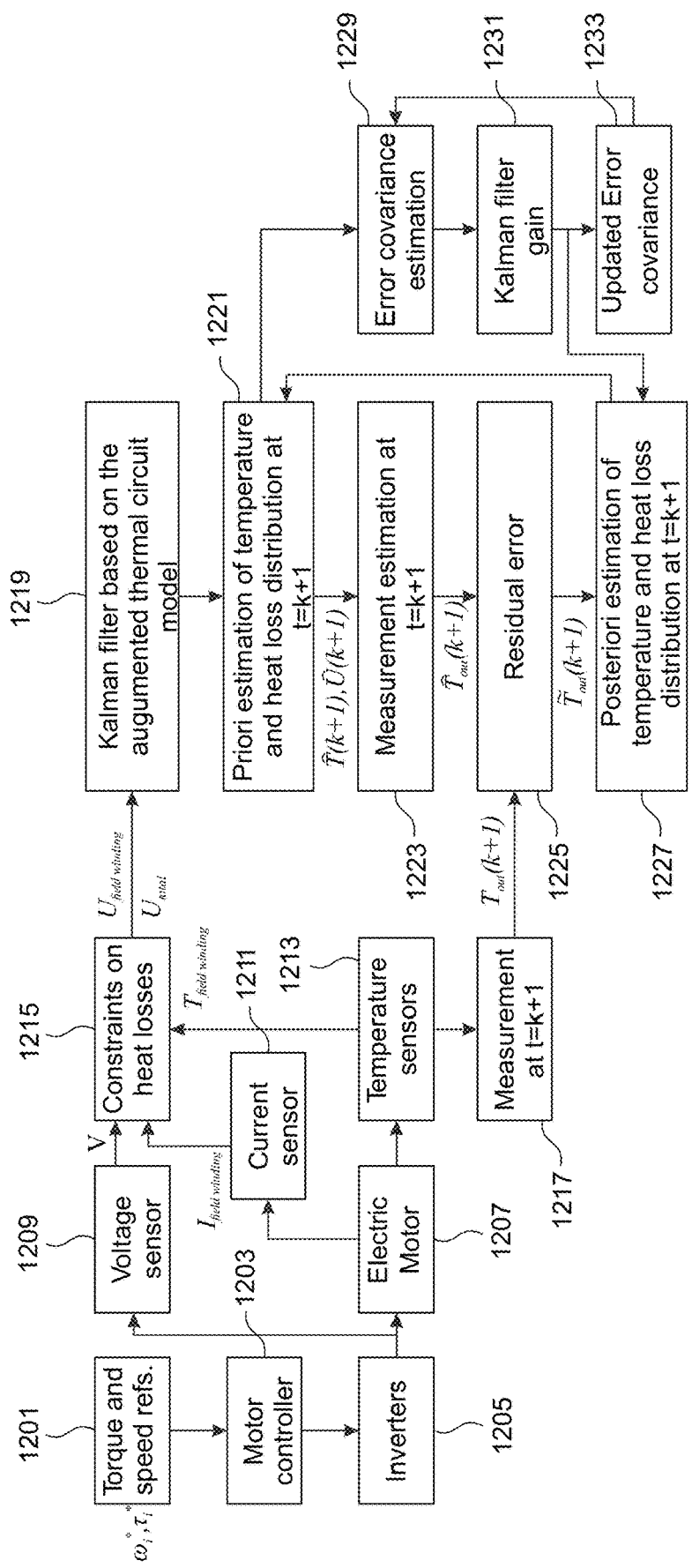
FIG. 12A shows a flow diagram of Kalman filter for online estimation of temperature and heat loss distribution in the electric motor, according to some embodiments.

FIG. 12A shows a flow diagram of Kalman filter for online estimation of temperature and heat loss distribution in the electric motor according to some embodiments Kalman filter works on prediction-upgradation on a model of linear time-variant/time-invariant systems. Since the augmented thermal circuit model in Eqn. (4) of the electric motor is a linear time-invariant system, the constrained online inverse heat transfer problem specified in the embodiment may be solved by using Kalman filter. The electric motor 1207 is associated with a motor controller 1203 which generate control commands based on the torque and speed references $\omega_i, \tau_i$ 501. An inverter 1205 generates voltage for the electric motor 1207 based on the generated control commands. A voltage sensor 1209 senses and produces voltage signal V based on voltage across the electric motor 1207. A current sensor 1211 generates current signal $I_{field\ winding}$ based on the current through field winding of the electric motor 1207. In some embodiments, the current sensor 1211 may produce both motor current signal that provides magnitude of current through the electric motor 1207 and motor field current signal that provides magnitude of current flowing in the field winding. Temperature sensors 1213 produce temperature signals based on temperatures at locations of the temperature sensors 1213. One or more of the produced temperature signals corresponds to temperature of field winding $T_{field-winding}$. Further, the temperature sensors 1213 provide temperature measurements at t=k+1 1217. Constraints on heat losses i.e. field winding loss $U_{fieldwinding}$ and total heat losses $U_{total}$ are determined 1215 based on the voltage signal, the current signal $I_{field\ winding}$ and the temperature signal $T_{field-winding}$.

The Kalman filter is established based on an augmented thermal circuit model 1219 subject to constraints where the total heat losses $U_{total}$ and the heat losses of field winding $U_{fieldwinding}$ are known 1215. Priori estimation of temperature and heat loss distribution in the electric motor 1221 at time t=k+1 is enabled with the Kalman filter. Priori estimation of the temperature and heat loss distribution in the electric motor at time t=k+1 yields temperature and heat loss values estimated at t=k+1 i.e. $\hat{T}(k+1) / \hat{U}(k+1)$ respectively. Further, temperature measurement estimation 1223 at t=k+1 is carried out to obtain value of temperature estimated $\hat{T}_{out}(k+1)$. Error covariance estimation 1229 is carried out to obtain estimated error covariance. Further, residual error 1225 is determined based on difference between the temperature estimated $\hat{T}_{out}(k+1)$ and the measured $T_{out}(k+1)$.

Posterior estimation of temperature and heat loss distribution at time t=k+1 is computed based on the determined residual error 1225. The Kalman filter gain 1231 and updated error covariance 1233 are determined in the posterior estimation of the temperature and the heat loss distribution 1227 at time t=k+1. Following the same procedure, the computed posterior estimation values will be used for next step priori estimation and estimation error covariance updates.

Based on the continuous-time augmented thermal circuit model defined by Eqn. (4), the discrete-time linear dynamical system is described as below $$\begin{bmatrix} T_k \\ u_k \end{bmatrix} = F_k \begin{bmatrix} T_{k-1} \\ u_{k-1} \end{bmatrix} + \begin{bmatrix} V_k \\ 0_{m \times q} \end{bmatrix} v_k + w_k \quad (5)$$

$$z_k = H_k \begin{bmatrix} T_k \\ u_k \end{bmatrix} + n_k$$

where $F_k$ is the discrete-time transition matrix.

The priori prediction process is given as below $$\begin{bmatrix} \hat{T}_{k \vee k-1} \\ \hat{u}_{k \vee k-1} \end{bmatrix} = F_k \begin{bmatrix} \hat{T}_{k-1 \vee k-1} \\ \hat{u}_{k-1 \vee k-1} \end{bmatrix} + \begin{bmatrix} V_k \\ 0_{m \times q} \end{bmatrix} v_k \quad (6)$$

$$P_{k \vee k-1} = \text{cov}\left( \begin{bmatrix} T_k \\ u_k \end{bmatrix} - \begin{bmatrix} \hat{T}_{k \vee k-1} \\ \hat{u}_{k \vee k-1} \end{bmatrix} \right)$$

$$F_k P_{k-1 \vee k-1} F_k^T + Q_k \ldots$$

where $P_{k|k-1}$ is the predicted error covariance.

For posteriori prediction, the updating algorithm is demonstrated as below $$\tilde{y}_k = z_k - H_k \begin{bmatrix} \hat{T}_{k \vee k-1} \\ \hat{u}_{k \vee k-1} \end{bmatrix} \quad (7)$$

$$K_k = (F_k P_{k-1 \vee k-1} F_k^T + Q_k) H_k^T$$

$$\begin{bmatrix} \hat{T}_{k \vee k} \\ \hat{u}_{k \vee k} \end{bmatrix} = \begin{bmatrix} \hat{T}_{k \vee k-1} \\ \hat{u}_{k \vee k-1} \end{bmatrix} + K_k \tilde{y}_k$$

$$P_{k \vee k} = \text{cov}\left( \begin{bmatrix} T_k \\ u_k \end{bmatrix} - \begin{bmatrix} \hat{T}_{k \vee k} \\ \hat{u}_{k \vee k} \end{bmatrix} \right)$$

$$(I - K_k H_k)(F_k P_{k-1 \vee k-1} F_k^T + Q_k)$$

where $\tilde{y}_k$ is the measurement residual, $K_k$ is the optimal Kalman gain, and $P_{k|k}$ is the updated estimate covariance.

For linear dynamical systems, Kalman filter produces optimal estimates in the sense of minimal covariance of estimation error. Without the presence of measurement noise, asymptotic estimation of temperature and heat loss distribution is achieved.

Figure 12B:
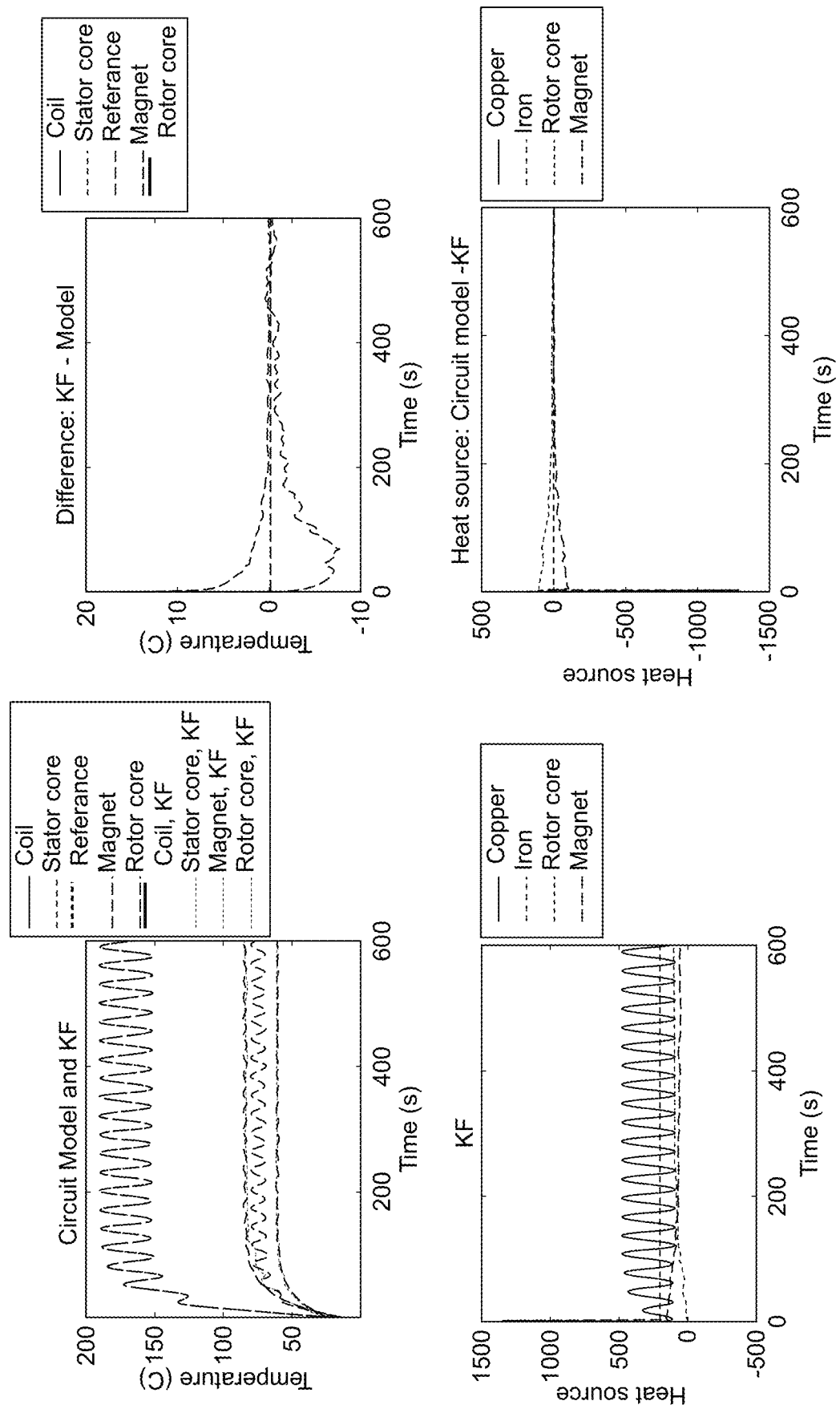
FIG. 12B shows numerical simulation results for online estimation of temperature and heat loss distribution in the electric motor using the Kalman filter.

FIG. 12B shows numerical simulation results for online estimation of temperature and heat loss distribution in the electric motor using the Kalman filter.

PD Observer

Figure 13A:
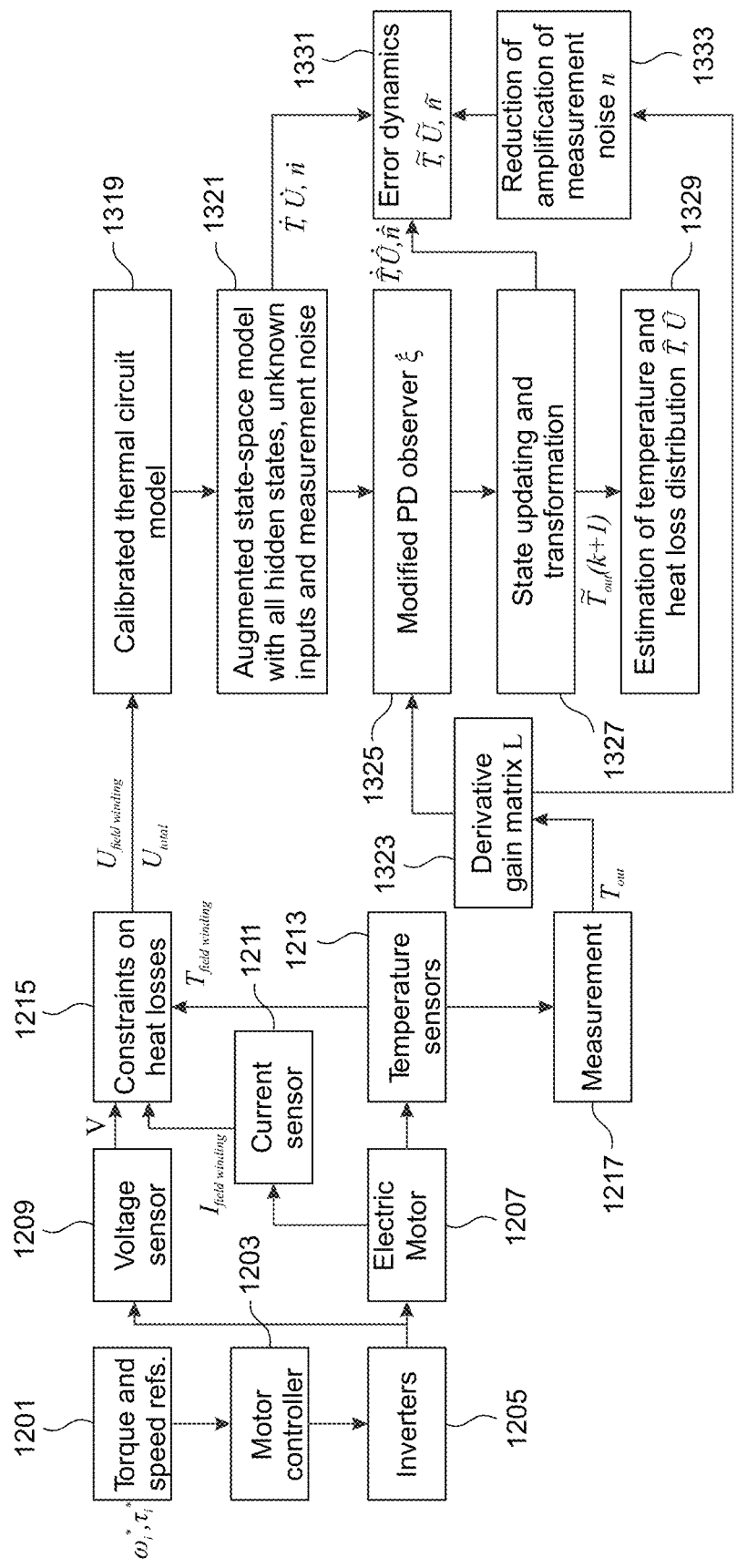
FIG. 13A shows a flow diagram of a proportional derivative (PD) observer for online estimation of temperature and heat loss distribution in the electric motor, according to some embodiments.

FIG. 13A shows a flow diagram of PD observer for online estimation of temperature and heat loss distribution in the electric motor according to some embodiments. The PD observer is designed for multi variable systems with measurement noises. As described above with reference to the FIG. 12A, the voltage sensor 1209, the current sensor 1211, the temperature sensor 1213 produce the voltage signal V, the current signal $I_{field\ winding}$ and temperature signal $T_{field-winding}$ respectively. Constraints on heat losses i.e. field winding loss $U_{fieldwinding}$ and total heat losses $U_{total}$ are determined 1215 based on the voltage signal V, the current signal $I_{field\ winding}$ and temperature signal $T_{field-winding}$. Further, the temperature sensors 1213 provide temperature measurements 1217 $T_{out}$.

An augmented state-space model with all hidden states, unknown heat inputs and measurement noises is established 1321 based on a calibrated thermal circuit model 1319 subject to constraints, where the total heat losses $U_{total}$ and the heat losses of field winding $U_{fieldwinding}$ are known 1215. With proper choice of derivative gain matrix L 1323, a modified PD observer is designed 1325 for estimation in avoidance of derivative terms. State updating and transformation 1327 is carried out and post state transformation, estimation of temperature and heat loss distribution 1329 of the motor is carried out to determine $\hat{T},\hat{U}$. i.e. value of estimated temperature and value of unknown heat losses. Besides that, the error dynamics 1331 between the augmented state-space model and PD observer is derived i.e. $\dot{\tilde{T}}, \dot{\tilde{U}}, \dot{\tilde{n}}$. The derivative gain matrix L 1323 is chosen to reduce the amplification of measurement noise 1333 in the error dynamics.

The PD observer is designed to estimate all the hidden states, unknown heat losses and measurement noises at the same time. Hence, an extended state-space model is given as below $$\tilde{E}\dot{\tilde{x}}(t) = \tilde{A}\tilde{x}(t) + \begin{bmatrix} V \\ 0_{(m+p)\times q} \end{bmatrix} v + \tilde{N}n_{p\times 1}(t) \quad (8)$$

$$y_n(t) = \tilde{C}\tilde{x}(t) \text{ where}$$

$$x_n(t) = n_{p\times 1}(t), \tilde{x}(t) = \begin{bmatrix} \begin{bmatrix} T(t) \\ u(t) \end{bmatrix} \\ x_n(t) \end{bmatrix}, \tilde{N} = \begin{bmatrix} 0 \\ I_p \end{bmatrix}, \quad (9)$$

$$\tilde{E} = \begin{bmatrix} I_{n+m} & 0_{(n+m)\times p} \\ 0_{p\times(n+m)} & 0_{p\times p} \end{bmatrix}, \tilde{A} = \begin{bmatrix} \begin{bmatrix} A & B \\ 0 & 0 \end{bmatrix} & 0_{(n+m)\times p} \\ 0_{p\times(n+m)} & -I_p \end{bmatrix},$$

$$\tilde{C} = [C \ 0_{p\times m} \ I_p]$$

If the matrix $$\left( \begin{bmatrix} A & B \\ 0 & 0 \end{bmatrix}, [C \ 0] \right)$$

is detectable and the noise is bounded, there exist the gain matrices $\tilde{L},\tilde{K} \in R^{(n+m+p)\times p}$ for the observer designed as below $$(\tilde{E} + \tilde{L}\tilde{C})\dot{\xi}(t) = \quad (10)$$

$$(\tilde{A} - \tilde{K}\tilde{C})\xi(t) + \begin{bmatrix} V \\ 0_{(m+p)\times q} \end{bmatrix} v + \tilde{A}(\tilde{E} + \tilde{L}\tilde{C})^{-1}\tilde{L}y_n(t)$$

$$\hat{\tilde{x}}(t) = \xi(t) + (\tilde{E} + \tilde{L}\tilde{C})^{-1}\tilde{L}y_n(t) \quad (11)$$

and $\hat{\tilde{x}}(t)$ is an asymptotic estimate of $\tilde{x}(t)$ in Eqn. (9).

Note that $$\text{rank} \begin{bmatrix} \tilde{E} \\ \tilde{C} \end{bmatrix} = \text{rank} \begin{bmatrix} \begin{bmatrix} I_{n+m} & 0_{(n+m)\times p} \\ 0_{p\times(n+m)} & 0_{p\times p} \end{bmatrix} \\ [C \ 0_{p\times m} \ I_p] \end{bmatrix} = n + m + p \quad (12)$$

then there always exists $\tilde{L} \in R^{(n+m+p)\times p}$ such that rank $(\tilde{E}+\tilde{L}\tilde{C})=n+m+p$, which means $(\tilde{E}+\tilde{L}\tilde{C})$ is invertible. For explicit $(\tilde{E}+\tilde{L}\tilde{C})$, write $\tilde{L}=[{}_{L_2}{}^{L_1}]$, where $L_1 \in R^{(n+m)\times p}, L_2 \in R^{p\times p}$, it may be shown that $$\tilde{C}(\tilde{E}+\tilde{L}\tilde{C})^{-1}\tilde{L}I_p \quad (13)$$

Substitute $\xi(t)=\hat{\tilde{x}}(t)-(\tilde{E}+\tilde{L}\tilde{C})^{-1}\tilde{L}y_n(t)$ into Eqn. (11) and using Eqn. (13), we may derive $$(\tilde{E} + \tilde{L}\tilde{C})\dot{\hat{\tilde{x}}}(t) = (\tilde{A} - \tilde{K}\tilde{C})\hat{\tilde{x}}(t) + \begin{bmatrix} V \\ 0_{(m+p)\times q} \end{bmatrix} v + \tilde{K}y_n(t)\tilde{L}\dot{y}_n(t) \quad (14)$$

Applying $L\dot{y}(t)$ to both sides of Eqn. (8) yields $$(\tilde{E} + \tilde{L}\tilde{C})\dot{\tilde{x}}(t) = \quad (15)$$

$$(\tilde{A} - \tilde{K}\tilde{C})\tilde{x}(t) + \begin{bmatrix} V \\ 0_{(m+p)\times q} \end{bmatrix} v + \tilde{K}y_n(t)\tilde{L}\dot{y}_n(t) + \tilde{N}n_{p\times 1}(t)$$

The error dynamics is formulated as below based on Eqn. (14-15)

$$\dot{\bar{e}}(t)=(\bar{E}+\overline{LC})^{-1}(\bar{A}-\overline{KC})\bar{e}(t)+(\bar{E}+\overline{LC})^{-1}\overline{N}n_{p\times 1}(t) \quad (16)$$

The term which contains measurement noise in eqn. (16) may be written as below $$(\tilde{E} + \tilde{L}\tilde{C})^{-1}\tilde{N}n_{p\times 1}(t) = \begin{bmatrix} -L_1 \\ I_p + CL_1 \end{bmatrix} (L_2)^{-1} n_{p\times 1}(t) \quad (17)$$

As may be evident from eqn. (17), a low gain $L_1$, for example, $L_1=0$, and a high-gain $L_2$ may be chosen to reduce the amplification of measurement noise.

Post carrying matrix computation in eqn. (17), yields $$\text{rank} \begin{bmatrix} sI_{n+m+p} - (\bar{E}+\overline{LC})^{-1}\bar{A} \\ \bar{C} \end{bmatrix} = \text{rank} \begin{bmatrix} s(\bar{E}+\overline{LC})-\bar{A} \\ \bar{C} \end{bmatrix} = \quad (18)$$

$$\text{rank} \begin{bmatrix} s\bar{E}-\bar{A} \\ \bar{C} \end{bmatrix} = \text{rank} \begin{bmatrix} sI_{n+m} - \begin{bmatrix} A & B \\ 0 & 0 \end{bmatrix} & 0_{(n+m)\times p} \\ 0_{p\times(n+m)} & I_p \\ C & I_p \end{bmatrix} =$$

$$\text{rank} \begin{bmatrix} sI_{n+m} - \begin{bmatrix} A & B \\ 0 & 0 \end{bmatrix} \\ C \end{bmatrix} + p$$

If $$\left( \begin{bmatrix} A & B \\ 0 & 0 \end{bmatrix}, C \right)$$

is detectable, Eqn. (18) means that $((\bar{E}+\overline{LC})^{-1}\bar{A}-\bar{K}*\bar{C})$ is detectable. Then $\tilde{K}^*$ may be selected such that $[(\bar{E}+\overline{LC})^{-1}\bar{A}-\bar{K}*\bar{C}]$ is a Hurwitz matrix, and $\tilde{K}=(\tilde{E}+\overline{LC})\tilde{K}^*$ Constrained online inverse heat transfer problem solving in the electric motor using the PD Observers:

Consider the modified thermal circuit model defined in Eqn (3) which is obtained by incorporating the constraints Eqn. (2). The extended state-space model for PD observer based on Eqn. (3) is formulated as below $$\bar{E}\dot{\bar{x}}(t) = \quad (19)$$

$$\bar{A}\bar{x}(t) + \begin{bmatrix} B(:,1) \\ 0_{(m+p)\times 1} \end{bmatrix} u_1(t) + \begin{bmatrix} V \\ 0_{(m+p)\times 2} \end{bmatrix} v + \begin{bmatrix} (c_2 - 6c_1)B(:,4) \\ 0_{(m+p)\times 1} \end{bmatrix} +$$

$$\bar{N}n_{p\times 1}(t)$$

$$y_n(t) = \bar{C}\bar{x}(t)$$

If the matrix $$\left(\begin{bmatrix} A & B_m \\ 0 & 0 \end{bmatrix}, [C\ 0_{p\times m}]\right)$$

is detectable and the noise is bounded, a modified PD observer for online estimation of temperature and heat loss distribution in the electrical motor is derived as below $$(\overline{E}+\overline{LC})\dot{\xi}(t) = (\overline{A}+\overline{KC})\xi(t) + \begin{bmatrix} B(:,1) \\ 0_{(m+p)\times 1} \end{bmatrix} u_1(t) + \begin{bmatrix} V \\ 0_{(m+p)\times 2} \end{bmatrix} \quad (20)$$

$$v + \begin{bmatrix} (c_2-6c_1)B(:,4) \\ 0_{(m+p)\times 1} \end{bmatrix} + \overline{A}(\overline{E}+\overline{LC})^{-1}Ly_n(t)$$

$$\hat{\overline{x}}(t) = \xi(t) + (\overline{E}+\overline{LC})^{-1}Ly_n(t) \quad (21)$$

where $\hat{\overline{x}}(t)$ is an asymptotic estimation of $\overline{x}(t)$ in Eqn. (21).

In the PD observer, if the system is detectable and the noise is bounded, there exist two design parameters which may provide more degrees of freedom. A derivative gain is chosen to minimize amplification of measurement noise, and a proportional gain is selected to guarantee stability of error dynamics. Hence, the PD observer may almost reject the measurement noise completely with properly chosen parameters. The choice of derivative gain is a trade-off between convergence speed and estimation error for PD observer. A larger derivative gain reduces the amplification of measurement noise greatly, but the convergence speed is really slow; a smaller gain speeds up the convergence process, but the estimation error caused by measurement noise is amplified.

Figure 13B:
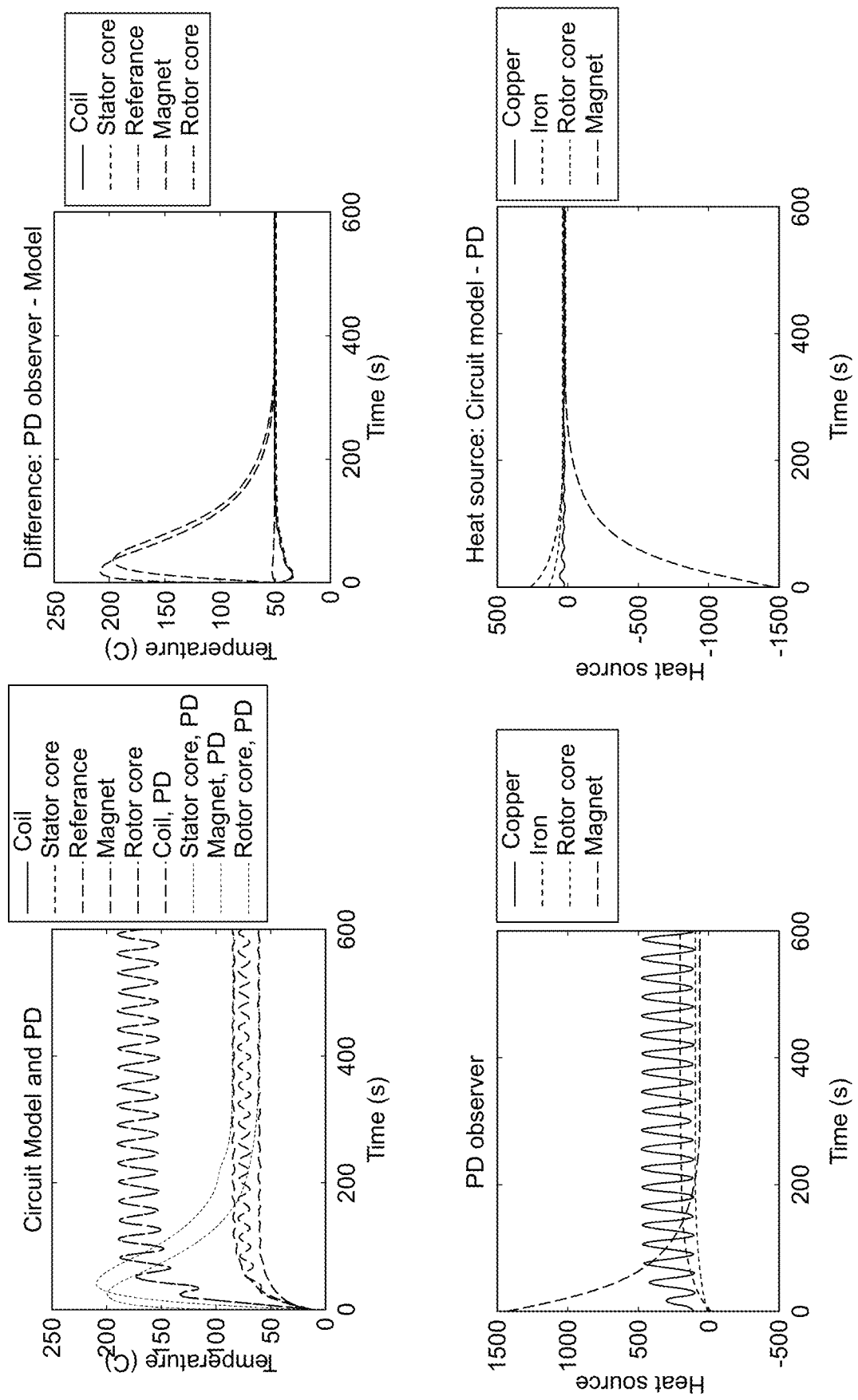
FIG. 13B shows numerical simulation results for online estimation of temperature and heat loss distribution in the electric motor using the PD observer.

FIG. 13B shows numerical simulation results for online estimation of temperature and heat loss distribution in the electric motor using the PD observer.

Adaptive Observer

Figure 14A:
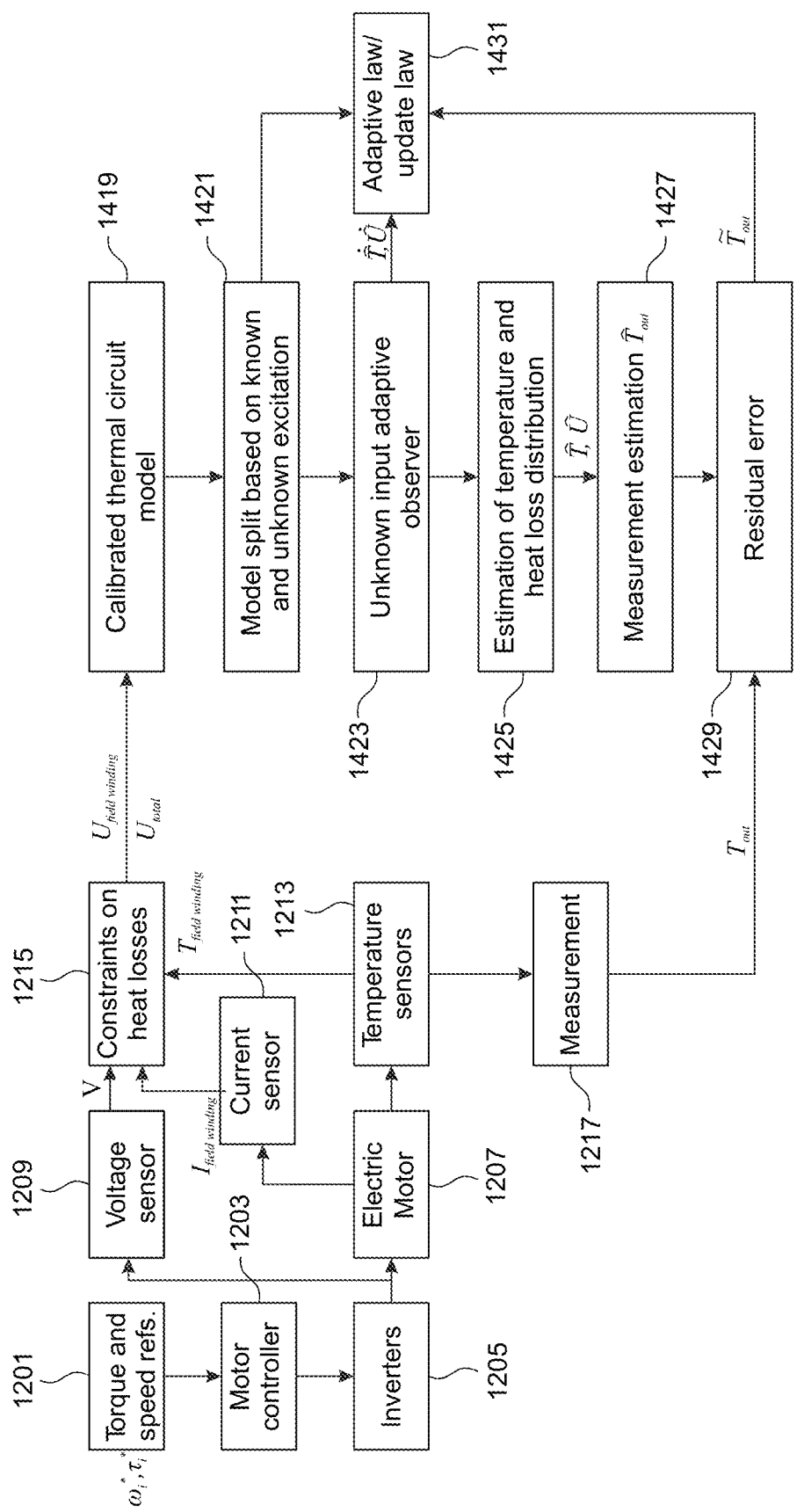
FIG. 14A shows a flow diagram of an adaptive observer for online estimation of temperature and heat loss distribution in the electric motor, according to some embodiments.

FIG. 14A shows a flow diagram of an adaptive observer for online estimation of temperature and heat loss distribution in the electric motor according to some embodiments. Adaptive observers are widely used in control theory for parameter estimation in adaptive control or fault estimation in fault detection and isolation. To solve the inverse heat transfer problem, the adaptive observer for online joint estimation of the temperature and the heat loss distribution in electric motor is designed. As described above with reference to the FIG. 12A, the voltage sensor 1209, the current sensor 1211, the temperature sensor 1213 produce the voltage signal V, the current signal $I_{field\ winding}$ and the temperature signal $T_{field-winding}$, respectively. Constraints on heat losses i.e. field winding loss $U_{fieldwinding}$ and total heat losses $U_{total}$ are determined 1215 based on the voltage signal V, the current signal $I_{field\ winding}$ and temperature signal $T_{field-winding}$. Further, the temperature sensors 1213 provide temperature measurement 1217 $T_{out}$.

With a calibrated thermal circuit model 1319 subject to constraints where the total heat losses $U_{total}$ and the heat losses of field winding $U_{fieldwinding}$ are known 1215, model split is performed based on known and unknown excitations 1421. Unknown input adaptive observer 1323 is established for estimation of temperature and heat loss distribution 1325 to determine $\hat{T}$, $\hat{U}$. i.e. value of estimated temperature and value of unknown heat losses. Further, temperature measurement estimation 1327 is carried out to determine $\hat{T}_{out}$. Further, residual error 1329 is determined based on difference between the estimated temperature measurement $\hat{T}_{out}$ and measured temperature $\hat{T}_{out}$. Adaptive law 1327 is designed for updating values of estimated temperature and unknown heat losses based on the residual error.

The first step of adaptive observer design is to split the original system in Eqn. (1) into subsystems $T_1$ and $T_2$ based on known and unknown excitation. The subsystems are derived as below $$\dot{T}_1(t)=(A-KC)T_1(t)+Vv+Ky(t)$$

$$\dot{T}_2(t)=(A-KC)T_2(t)+Bu(t) \quad (22)$$

The estimators for the subsystems in Eqn. (22) are formulated as below $$\dot{\hat{T}}_1(t)=(A-KC)\hat{T}_1(t)+Vv+Ky_n(t)$$

$$\dot{\hat{T}}_2(t)=(A-KC)\hat{T}_2(t)+B\hat{u}(t)+\sigma(t) \quad (23)$$

where $\hat{u}(t)$ is an estimate of unknown $u(t)$, and $\sigma(t)$ compensates the estimation error caused by $\hat{u}(t)$.

Since the subsystem $\hat{T}_2$ is excited by $\hat{u}$, it may be assumed that $$\hat{T}_2(t)=\gamma(t)\hat{u}(t) \quad (24)$$

Substitute Eqn. (24) into Eqn. (23), we have $$\dot{\gamma}(t)=(A-KC)\gamma(t)+B, \sigma(t)=\gamma(t)\dot{\hat{u}}(t) \quad (25)$$

For online estimation of temperature and heat loss distribution in the electric motor, the following assumptions may be specified:

Assumption 1: There exists a gain matrix $K \in R^n \times R^p$ such that the system $\dot{\eta}(t)=(A-KC)\eta(t)$ is exponentially stable.

Assumption 2: (Persistent excitation condition) For $\dot{\gamma}(t) = (A-KC)\gamma(t)+B$, where $\gamma(t) \in R^n \times R^m$, there always exist positive constants $\alpha, \beta, T$ such that $$\alpha 1 \leq \int_t^{t+T} \gamma^T(\tau)C^T\Sigma(\tau)C\gamma(\tau)d\tau \leq \beta 1 \quad (26)$$

is always satisfied. In Eqn. (26), Eqn. (26), $\Sigma$ is the covariance matrix. $\dot{u}(t)=0$, or $u(t)$ is slowly changing.

With the aforesaid assumptions, the algorithm for adaptive observer design is formulated as below $$\dot{\hat{T}}(t)=A\hat{T}(t)+B\hat{u}(t)+K(y_n(t)-C\hat{T}(t))+\gamma(t)\dot{\hat{u}}(t)+Vv$$

$$\dot{\hat{u}}(t)=\Gamma\gamma^T(t)C^T\Sigma(y_n(t)-C\hat{T}(t)) \quad (27)$$

Based on Eqn. (22) and Eqn. (27), the error dynamics is derived as below $$\dot{\tilde{T}}(t)=(A-KC)\tilde{T}(t)+B\tilde{u}(t)+\gamma(t)\dot{\hat{u}}(t)+Kn(t) \quad (28)$$

For stability analysis, define $$\eta(t)=\tilde{T}(t)-\gamma(t)\tilde{u}(t) \quad (29)$$

Substituting Eqn. (29) into Eqn. (28), with Assumption 3, we have $$\dot{\eta}(t)=(A-KC)\eta(t)+Kn(t) \quad (30)$$

With Eqns. (28-30), it can be derived that:

$$\dot{\tilde{u}}(t)=-\Gamma\gamma^T(t)C^T\Sigma C(\gamma(t)\tilde{u}(t)+\eta(t))+\Gamma\gamma^T(t)C^T\Sigma n(t) \quad (31)$$

As may be evident from Eqn. (31), although the dynamic of $\eta(t)$ is corrupted by measurement noise $n(t)$, because $(A-KC)$ is Hurwitz matrix, still converges to a bounded value, this also applies to the error dynamics of $\tilde{u}(t)$ because of the persistent excitation condition. The computational complexity of Adaptive observer is between Kalman filter and Luenberger observer. The time to achieve convergence is faster than that of Luenberger observer, and its fluctuation is stronger than that of Kalman filter. Adaptive observer is favored if one only has a moderate computational power and wants to track the temperatures as fast as possible.

Constrained Online Inverse Heat Transfer Problem Solving in the Electric Motor Using the Adaptive Observer:

Consider the modified thermal circuit model defined in Eqn (3) which is obtained by incorporating the constraints Eqn. (2). The adaptive observer for the specific inverse heat transfer problem defined in Eqn. (3) is formulated as below $$\dot{\hat{T}}(t)=A\hat{T}(t)+B_m\hat{u}(t)+K(y_n(t)-C\hat{T}(t)+\gamma(t)\hat{u}(t)+B(:,1)u_1(t)+Vv+(c_2-6c_1)B(:,4) \quad (32)$$

$$\dot{\hat{u}}(t)=\Gamma\gamma^T(t)C^T\Sigma(y_n(t)-C\hat{T}(t) \quad (33)$$

Figure 14B:
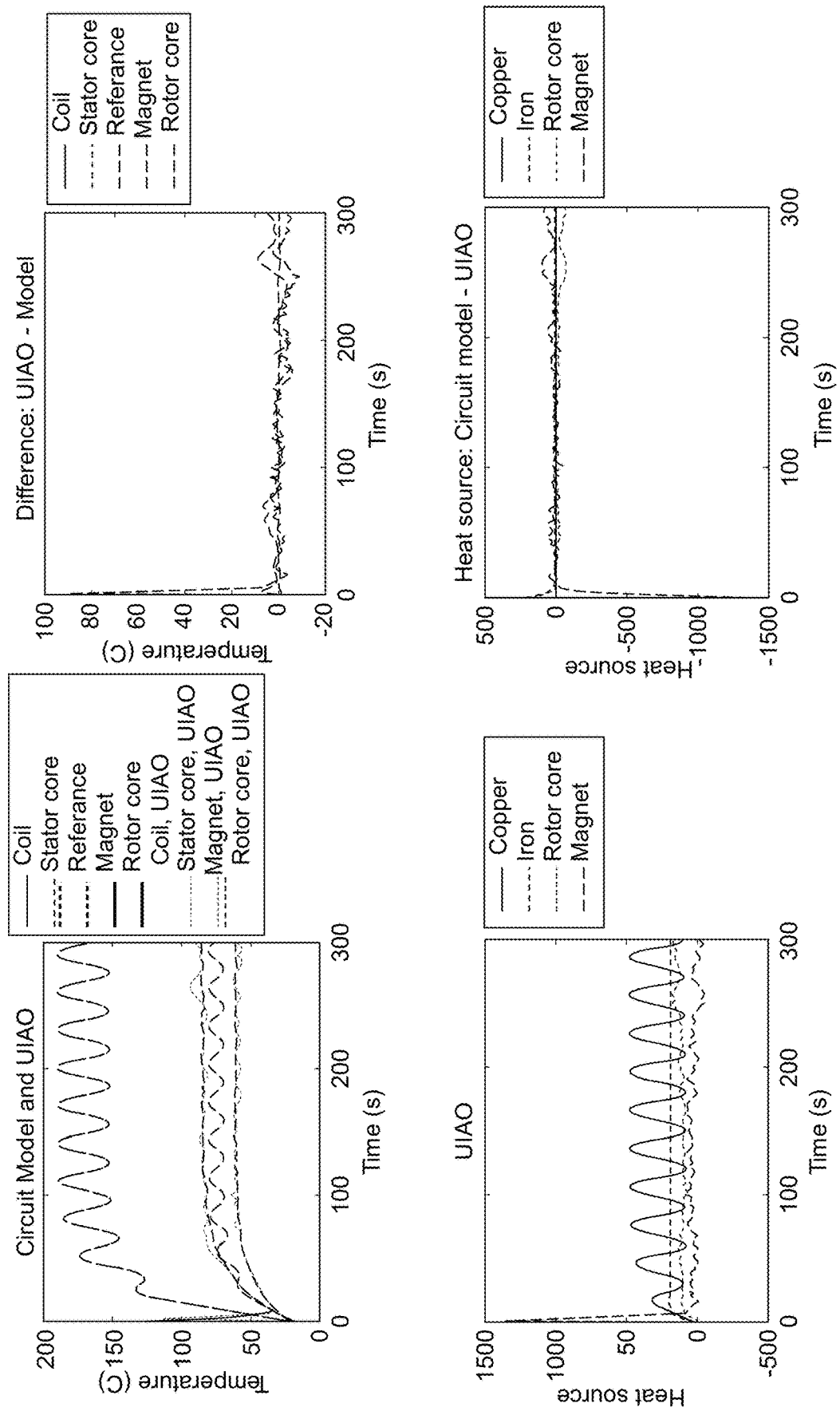
FIG. 14B shows numerical simulation results for online estimation of temperature and heat loss distribution in the electric motor using the adaptive observer.

FIG. 14B shows numerical simulation results for online estimation of temperature and heat loss distribution in the electric motor using the adaptive observer.

L1 Adaptive Observer

Figure 15A:
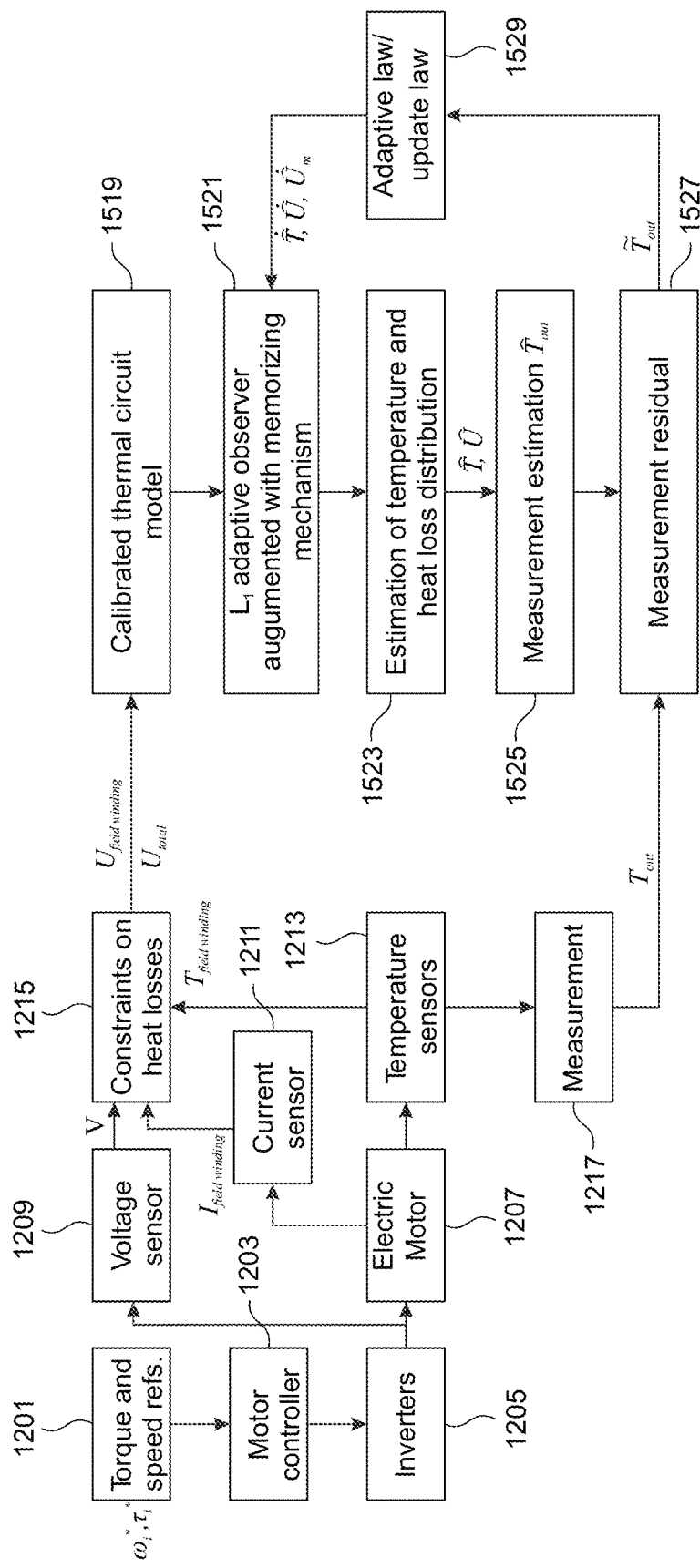
FIG. 15A shows a flow diagram of L1 adaptive observer for online estimation of temperature and heat loss distribution in the electric motor, according to some embodiments.

FIG. 15A shows a flow diagram of an $L_1$ adaptive observer for online estimation of temperature and heat loss distribution in the electric motor according to some embodiments. The components of $L_1$ adaptive observer for online estimation of temperature and heat loss distribution in electric motors use error dynamics and adaptive law.

As described above with reference to the FIG. 12A, the voltage sensor 1209, the current sensor 1211, the temperature sensor 1213 produce the voltage signal V, the current signal $I_{field\ winding}$ and temperature signal $T_{field-winding}$ respectively. Constraints on heat losses i.e. field winding loss $U_{fielddwinding}$ and total heat losses $U_{total}$ are determined 1215 based on the voltage signal V, the current signal $I_{field\ winding}$ and the temperature signal $T_{field-winding}$. Further, the temperature sensors 1213 provide temperature measurements 1217 $T_{out}$.

An $L_1$ adaptive observer is established based on the calibrated thermal circuit model 1517 subject to constraints where the total heat losses $U_{total}$ and the heat losses of field winding $U_{fieldwinding}$ are known 1215. When adaptive parameters are updated during each time step, the unknowns have to be neglected for solving error dynamic equation. Consequently, neglecting the unknowns may introduce an estimation error in the adaptive parameter. In order to lessen the magnitude of the estimation error in the adaptive parameter, $L_1$ adaptive observer is augmented with a memorizing mechanism 1521. $L_1$ adaptive observer may amplify the measurement noises due to memorizing mechanism.

Estimation of temperature and heat loss distribution 1523 is enabled with the L1 adaptive observer to determine $\hat{T}$, $\hat{U}$. i.e. value of estimated temperature and value of unknown heat losses. Further, temperature measurement estimation 1525 is carried out to determine $\hat{T}_{out}$. Further, residual error 1527 is determined based on difference between the estimated temperature measurement $\hat{T}_{out}$ and the measured temperature $T_{out}$. Error dynamics between the calibrated thermal circuit model and $L_1$ adaptive observer is derived. The adaptive law 1529 updates the heat loss distribution by driving the error dynamics equal to zero at each time step with the neglecting unknown terms.

The $L_1$ adaptive observer is formulated as below:

$$\dot{\hat{T}}(t)=(A-KC)\hat{T}(t)+B\hat{u}(t)+B\hat{u}_m(t)+Ky_n(t)+Vv \quad (34)$$

where $\hat{u}(t)$ and $\hat{u}_m(t)$ are adaptive parameters. Additionally, $\hat{u}_m(t)$ is the memorizing term, which is added for compensating the estimation error caused by neglecting the unknowns when solving the error dynamic equations.

For the derivation of the adaptive law, the error dynamics are to be derived. Based on Eqn. (1) and Eqn. (29), the error dynamics are derived as:

$$\dot{\tilde{T}}(t)=(A-KC)\tilde{T}(t)+B\hat{u}(t)+B\hat{u}_m(t)-Bu(t) \quad (35)$$

The solution to error dynamics in Eqn. (30) is expanded as below $$\tilde{T}((i+1)T_s) = e^{(A-KC)T_s}\tilde{T}(iT_s) + \int_0^{T_s} e^{(A-KC)(T_s-\tau)}(B\hat{u}(\tau)-Bu(\tau))d\tau = \quad (36)$$

$$e^{(A-KC)T_s}\tilde{T}(iT_s) + \int_0^{T_s} e^{(A-KC)(T_s-\tau)}B\hat{u}(\tau)d\tau -$$

$$\int_0^{T_s} e^{(A-KC)(T_s-\tau)}Bu(\tau)d\tau =$$

$$e^{(A-KC)T_s}\tilde{T}(iT_s) + \int_0^{T_s} e^{(A-KC)(T_s-\tau)}Bd\tau\hat{u}(iT_s) -$$

$$\int_0^{T_s} e^{(A-KC)(T_s-\tau)}Bu(\tau)d\tau = e^{(A-KC)T_s}\begin{bmatrix}\tilde{y}(iT_s)\\ \tilde{z}(iT_s)\end{bmatrix} +$$

$$\int_0^{T_s} e^{(A-KC)(T_s-\tau)}Bd\tau\hat{u}(iT_s) - \int_0^{T_s} e^{(A-KC)(T_s-\tau)}Bu(\tau)d\tau =$$

$$e^{(A-KC)T_s}\begin{bmatrix}\tilde{y}(iT_s)\\ 0\end{bmatrix} + \int_0^{T_s} e^{(A-KC)(T_s-\tau)}Bd\tau\hat{u}(iT_s) +$$

$$e^{(A-KC)T_s}\begin{bmatrix}0\\ \tilde{z}(iT_s)\end{bmatrix} - \int_0^{T_s} e^{(A-KC)(T_s-\tau)}Bu(\tau)d\tau$$

The adaptive parameter is updated by driving the error $\tilde{T}((i+1)T_s)$ to zero at each time step, to obtain:

$$\tilde{T}((i+1)T_s) = e^{(A-KC)T_s}\begin{bmatrix}\tilde{y}(iT_s)\\ 0\end{bmatrix} + \int_0^{T_s} e^{(A-KC)(T_s-\tau)}Bd\tau\hat{u}(iT_s) + \quad (37)$$

$$e^{(A-KC)T_s}\begin{bmatrix}0\\ \tilde{z}(iT_s)\end{bmatrix} - \int_0^{T_s} e^{(A-KC)(T_s-\tau)}Bu(\tau)d\tau = 0$$

By ignoring the unknown terms in Eqn. (37), the adaptive law is derived as below $$\hat{u}(iT_s) = -\left[\left(\int_0^{T_s} e^{(A-KC)(T_s-\tau)}Bd\tau\right)^T\left(\int_0^{T_s} e^{(A-KC)(T_s-\tau)}Bd\tau\right)\right]^{-1} \quad (38)$$

$$\left(\int_0^{T_s} e^{(A-KC)(T_s-\tau)}Bd\tau\right)^T e^{(A-KC)T_s}\begin{bmatrix}\tilde{y}(iT_s)\\ 0\end{bmatrix}$$

where $\tilde{y}(it_s)=\hat{y}(iT_s)-y_n(iT_s)$.

The memorizing term is updated as below $$\hat{u}_m(iT_s)=\hat{u}_m((i-1)+\hat{u}(iT_s)T_s \quad (39)$$

Substitute Eqns. (38-39) into Eqn. (34), the updated states for next time step may be obtained:

$$\hat{T}((i+1)T_s)=\hat{T}(iT_s)+\dot{\hat{T}}(iT_s)T_s \quad (40)$$

The augmentation of $L_1$ adaptive observer with the memorizing mechanism yields an improvement on relaxing hardware requirement because sampling time limitation exists in real-world application. Further, the improvement on relaxing hardware requirement lead to cost effectiveness of utilized hardware.

Constrained online inverse heat transfer problem solving in the electric motor using the $L_1$ adaptive observer:

Consider the modified thermal circuit model defined in Eqn (3) which is obtained by incorporating the constraints in Eqn. (2). For the specific inverse heat transfer problem defined in Eqn. (3), the $L_1$ adaptive observer is formulated as below $$\dot{\hat{T}}=(A-KC)\hat{T}(t)+B_m\hat{u}(t)+B_m\hat{u}_m(t)+Ky_n(t)+B(:,1)u_1(t)+Vv+(c_2-6c_1)B(:,4) \quad (41)$$

At time $t=iT_s$, where $T_s$ is the time step, the adaptive law is updated as below $$\hat{u}(iT_s) = -\left[\left(\int_0^{T_s} e^{(A-KC)(T_s-\tau)} B_m d\tau\right)^T \left(\int_0^{T_s} e^{(A-KC)(T_s-\tau)} B_m d\tau\right)\right]^{-1} \quad (42)$$

$$\left(\int_0^{T_s} e^{(A-KC)(T_s-\tau)} B_m d\tau\right)^T e^{(A-KC)T_s} \begin{bmatrix} \tilde{y}(iT_s) \\ 0 \end{bmatrix}$$

And the memorizing term is updated as below $$\hat{u}_m(iT_s) = \hat{u}_m((i-1)T_s) + \hat{u}(iT_s)T_s \quad (43)$$

Figure 15B:
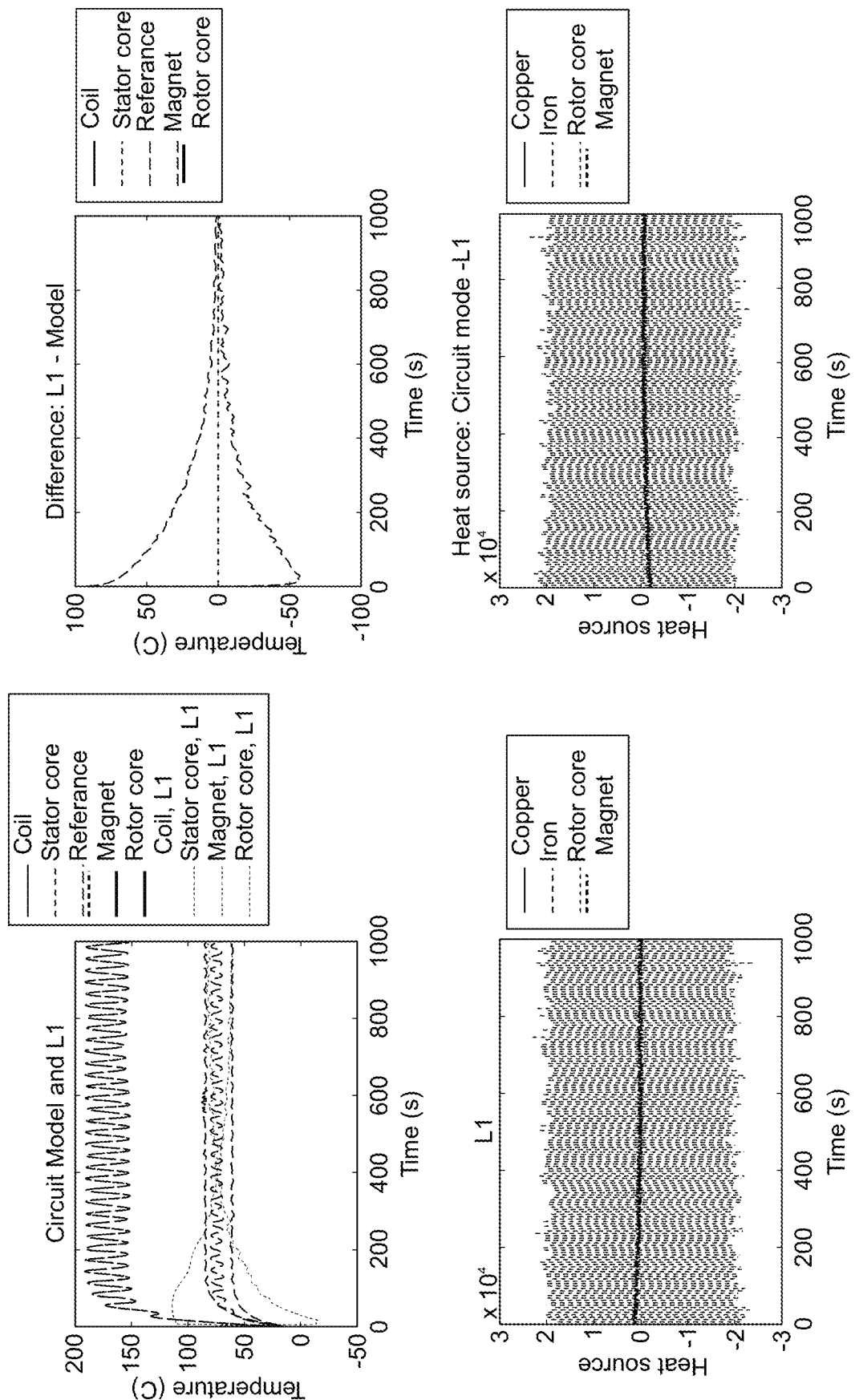
FIG. 15B shows numerical simulation results for online estimation of temperature and heat loss distribution in the electric motor using the L1 adaptive observer.

FIG. 15B shows numerical simulation results for online estimation of temperature and heat loss distribution in the electric motor using the $L_1$ adaptive observer

Luenberger Observer

Figure 16A:
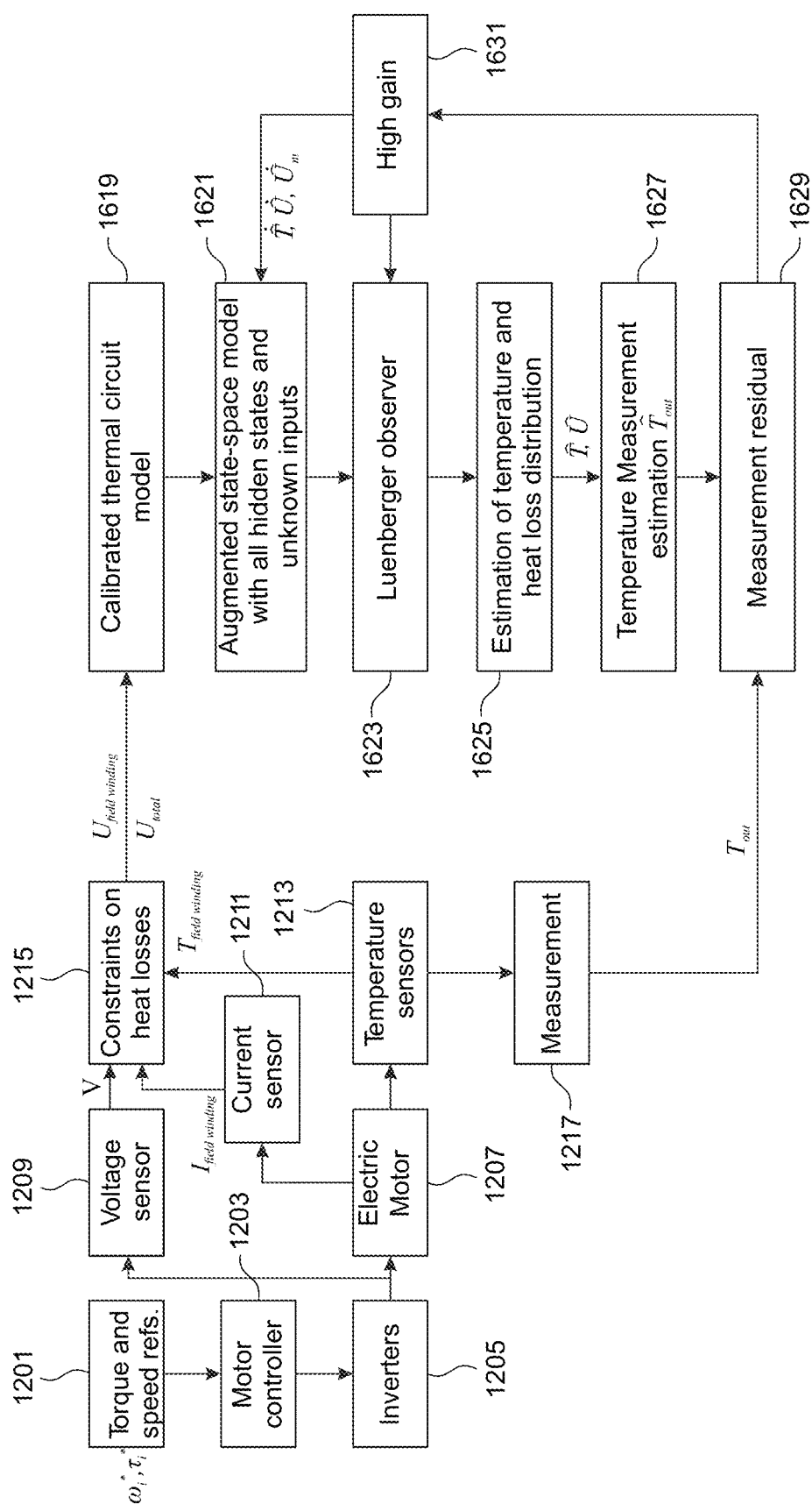
FIG. 16A shows a flow diagram of Luenberger observer for online estimation of temperature and heat loss distribution in the electric motor, according to some embodiments.

FIG. 16A shows a flow diagram of Luenberger observer for online estimation of temperature and heat loss distribution in the electric motor according to some embodiments. Luenberger observer holds good for output feedback linear time-invariant (LTI) systems. For the specified online inverse heat transfer problem in electric motors, once detectability of the system is guaranteed, Luenberger observer may be applied for exponentially convergence of estimation error.

As described above with reference to the FIG. 12A, the voltage sensor 1209, the current sensor 1211, the temperature sensor 1213 produce the voltage signal V, the current signal $I_{field\ winding}$ and the temperature signal $T_{field-winding}$ respectively. Constraints on heat losses i.e. field winding loss $U_{fieldwinding}$ and total heat losses $U_{total}$ are determined 1215 based on the voltage signal V, the current signal $I_{field\ winding}$ and temperature signal $T_{field-winding}$. Further, the temperature sensors 1213 provide temperature measurements 1217 $T_{out}$.

An augmented state-space model with all hidden states, unknown heat inputs and measurement noises 1621 and Luenberger observer 1623 are established respectively based on a calibrated thermal circuit model 1619 subject to constraints, where the total heat losses $U_{total}$ and the heat losses of field winding $U_{fieldwinding}$ are known 1215. Estimation of temperature and heat loss distribution 1625 in the electric motor is enabled with the Luenberger observer 1623 to determine $\hat{T}$, $\hat{U}$, i.e. value of estimated temperature and value of unknown heat losses. Further, temperature measurement estimation 1627 is carried out to determine $\hat{T}_{out}$. Further, residual error 1629 is determined based on difference between the estimated temperature measurement $\hat{T}_{out}$ and measured temperature $T_{out}$. The residual error multiplied by high gain 1631 is incorporated into the Luenberger observer as a feedback term.

The Luenberger observer is formulated as below based on Eqn. (1)

$$\begin{bmatrix} \dot{\hat{T}}(t) \\ \dot{\hat{u}}(t) \end{bmatrix} = \begin{bmatrix} A & B \\ 0 & 0 \end{bmatrix} \begin{bmatrix} \hat{T}(t) \\ \hat{u}(t) \end{bmatrix} + \begin{bmatrix} V \\ 0_{p\times q} \end{bmatrix} v + K(y_n(t) - C\hat{T}(t)) \quad (44)$$

According to Eqn. (1) and Eqn. (44), the error dynamics is derived as below $$\begin{bmatrix} \dot{\tilde{T}}(t) \\ \dot{\tilde{u}}(t) \end{bmatrix} = \left(\begin{bmatrix} A & B \\ 0 & 0 \end{bmatrix} - KC\right) \begin{bmatrix} \tilde{T}(t) \\ \tilde{u}(t) \end{bmatrix} + Kn(t) \quad (45)$$

As may be observed from Eqn. (45), the error dynamics will be affected by the measurement noise. Luenberger observer is computationally efficient and suitable for fast on-line estimation with limited computational resources.

Constrained online inverse heat transfer problem solving in the electric motor using the Luenberger Observer Consider the modified thermal circuit model defined in Eqn (3) which is obtained by incorporating the constraints in Eqn. (2). Based on Eqn. (3), the Luenberger observer is formulated as below:

$$\begin{bmatrix} \dot{\hat{T}}(t) \\ \begin{bmatrix} \dot{\hat{u}}_2(t) \\ \dot{\hat{u}}_3(t) \end{bmatrix} \end{bmatrix} = \begin{bmatrix} A & B_m \\ 0 & 0 \end{bmatrix} \begin{bmatrix} \hat{T}(t) \\ \begin{bmatrix} \hat{u}_2(t) \\ \hat{u}_3(t) \end{bmatrix} \end{bmatrix} + Vv + \quad (46)$$

$$B(:,1)u_1(t) + K(y_n(t) - C\hat{T}(t)) + (c_2 - 6c_1)B(:,4)$$

Figure 16B:
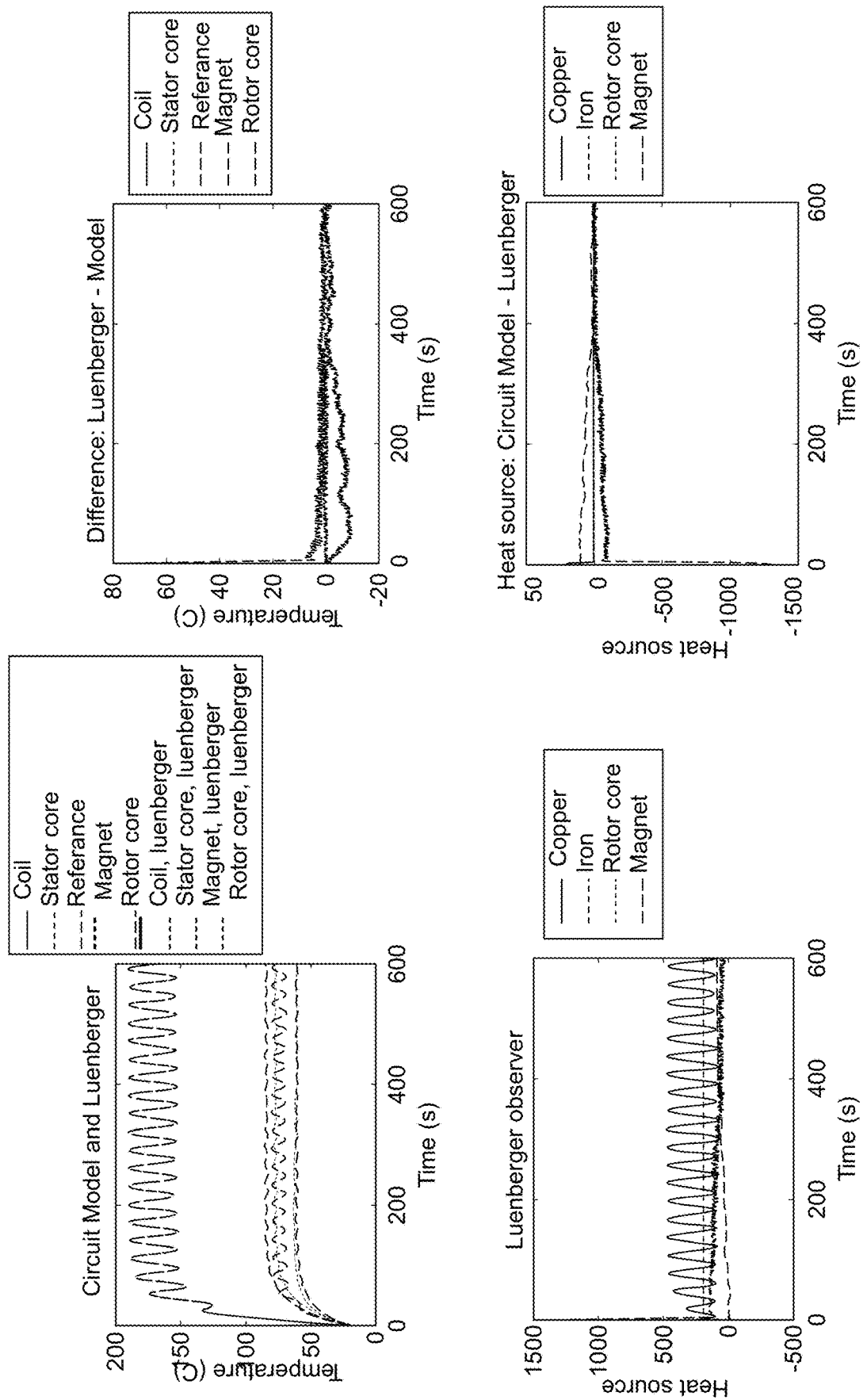
FIG. 16B shows numerical simulation results for online estimation of temperature and heat loss distribution in the electric motor using the Luenberger observer.

FIG. 16B shows numerical simulation results for online estimation of temperature and heat loss distribution in the electric motor using the Luenberger observer.

Online estimation of temperature distribution in electric motors in the presence of measurement noise and model mismatch using PID Observer As heat diffusion is a partial differential equation (PDE) described process, direct computation and analysis on PDE systems are difficult and time-consuming, it is preferred to construct an ordinary differential equation (ODE) described thermal circuit model. However, there exists mismatch for model reduction from infinite dimensional PDE to finite dimensional ODE. Handling of model mismatch is a hurdle for the specified online estimation problem.

In the present disclosure, the FEM model is taken as the "ground truth", on the basis of a thermal circuit model given below $$\dot{x}(t) = Ax(t) + Bu(t) + Vv + Md_{q\times 1}(t)$$

$$y_n(t) = Cx(t) + n(t) \quad (47)$$

where $d_{q\times 1}(t)$ is model mismatch, a PID observer is designed for online estimation of temperature distribution in electric motors in the presence of measurement noise and model mismatch.

In the specified problem, u(t) is assumed to be known. An extended state-space model is derived as below $$\bar{E}\dot{\bar{x}}(t) = \bar{A}\bar{x}(t) + \bar{B}u(t) + \bar{V}v + \bar{N}n(t) + \bar{M}d(t)y_n(t) = \bar{C}\bar{x}(t) \quad (48)$$

where $$x_n(t) = n_{p\times 1}(t),\ \bar{x}(t) = \begin{bmatrix} x(t) \\ x_n(t) \end{bmatrix},\ \bar{N} = \begin{bmatrix} 0 \\ I_p \end{bmatrix},$$

$$\bar{E} = \begin{bmatrix} I_n & 0_{(n)\times p} \\ 0_{p\times(n)} & 0_{p\times p} \end{bmatrix},$$

$$\bar{A} = \begin{bmatrix} A & 0_{(n)\times p} \\ 0_{p\times(n)} & -I_p \end{bmatrix},\ \bar{C} = [C\ I_p].$$

If (A,C) is detectable, measurement noise n(t) is bounded, and $$\text{rank}\left(\begin{bmatrix} A & M \\ C & 0 \end{bmatrix}\right) = n + q,$$

then there exists gain matrix $L, \bar{K} \in R^{(n+p)\times p}$, $K_f \in R^{q\times p}$ for the observer designed as below $$(\tilde{E}+\tilde{L}\tilde{C})\dot{\xi}(t)=(\tilde{A}-\tilde{K}\tilde{C})\xi(t)+\tilde{B}u(t)+\tilde{V}v+\tilde{A}(\tilde{E}+\tilde{L}\tilde{C})^{-1}\tilde{L}y_n(t)+\tilde{M}\hat{d}(t) \quad (49)$$

$$\dot{\hat{d}}(t)=-K_I\overline{C}\xi(t) \quad (50)$$

And $\bar{x}(t)=\xi(t)+(\bar{e}+\overline{LC})^{-1}\overline{L}y_n(t)$ is an asymptotic estimation of $\bar{x}(t)$ in Eqn. (48).

It may be inferred that $$\text{rank}\begin{bmatrix}\overline{E}\\ \overline{C}\end{bmatrix}=\text{rank}\begin{bmatrix}\begin{bmatrix}I_n & 0_{(n)\times p}\\ 0_{p\times(n)} & 0_{p\times p}\end{bmatrix}\\ [C\ I_p]\end{bmatrix}=n+p,$$

hence, $\overline{L}\in R^{(n+p)\times p}$ exists, and rank$(\overline{E}+\overline{LC})$=n+p.

For explicit $(\overline{E}+\overline{LC})$, this can be written as:

$$\overline{L}=\begin{bmatrix}L_1\\ L_2\end{bmatrix}, L_1\in R^{(n)\times p},$$

$$L_2\in R^{p\times p}, \overline{C}(\overline{E}+\overline{LC})^{-1}\overline{L}=I_p.$$

Applying state transformation yields $$\xi(t)=\bar{x}(t)-(\overline{E}+\overline{LC})^{-1}\overline{L}y_n(t) \quad (51)$$

Substituting Eqn. (51) into Eqn. (49), an estimator may be derived as below $$(\overline{E}+\overline{LC})\dot{\hat{x}}(t)=(\overline{A}-\overline{KC})\hat{x}(t)+\overline{B}u(t)+\overline{V}v+\overline{K}y_n(t)+\overline{L}\dot{y}_n(t)+\overline{M}\hat{d}(t) \quad (52)$$

$$\dot{\hat{d}}(t)=K_I[y_n(t)-\overline{C}\hat{x}(t)] \quad (53)$$

Applying $L\dot{y}(t)$ to both sides of Eqn. (48) to get $$(\overline{E}+\overline{LC})\dot{\bar{x}}(t)=(\overline{A}-\overline{KC})\bar{x}(t)+\overline{B}u(t)+\overline{V}v+\overline{M}d(t)+\overline{K}y_n(t)+\overline{L}\dot{y}_n(t)+\overline{N}n_{p\times 1}(t) \quad (54)$$

The error dynamics is derived as below based on Eqns. (53-54)

$$\dot{\bar{e}}(t)=(\overline{E}+\overline{LC})^{-1}(\overline{A}-\overline{KC})\bar{e}(t)+(\overline{E}+\overline{LC})^{-1}\overline{N}n_{p\times 1}(t)+(\overline{E}+\overline{LC})^{-1}\overline{M}e_d(t) \quad (55)$$

$$\dot{e}_d(t)=-K_I\overline{C}\bar{e}(t) \quad (56)$$

where $\bar{e}(t)=\bar{x}(t)-\hat{x}(t)$, $e_d(t)=d(t)-\hat{d}(t)$.

Reorganizing Eqns. (55-56) and combine them into one equation yields $$\begin{bmatrix}\overline{E}+\overline{LC} & 0\\ 0 & I_q\end{bmatrix}\begin{bmatrix}\dot{\bar{e}}(t)\\ \dot{e}_d(t)\end{bmatrix}= \left(\begin{bmatrix}\overline{A} & \overline{M}\\ 0 & 0\end{bmatrix}-\begin{bmatrix}\overline{K}\\ K_I\end{bmatrix}[\overline{C}\ 0]\right)\begin{bmatrix}\bar{e}(t)\\ e_d(t)\end{bmatrix}+\begin{bmatrix}\overline{N}\\ 0\end{bmatrix}n(t). \quad (57)$$

Denote $$\tilde{E}\begin{bmatrix}\overline{E}+\overline{LC} & 0\\ 0 & I_q\end{bmatrix}, \tilde{K}=\begin{bmatrix}\overline{K}\\ K_I\end{bmatrix}, \tilde{N}=\begin{bmatrix}\overline{N}\\ 0\end{bmatrix}.$$

The effect of measurement noise on the error dynamics may be observed by expanding the last term on the right of Eqn. (57)

$$\tilde{E}^{-1}\tilde{N}n_{p\times 1}(t)=\begin{bmatrix}-L_1\\ I_p+CL_1\\ 0\end{bmatrix}(L_2)^{-1}n_{p\times 1}(t) \quad (58)$$

For the rejection of measurement noise, it is suggested that $L_1=0_{n\times p}$, $L_2=\text{diag}(\alpha_1,\alpha_2,\ldots,\alpha_p)$, $(\alpha_1,\alpha_2,\ldots,\alpha_p)$ should be as large as possible, and meanwhile $(\overline{E}+\overline{LC})$ should be guaranteed nonsingular.

If (A,C) is detectable, and $$\text{rank}\left(\begin{bmatrix}A & M\\ C & 0\end{bmatrix}\right)=n+q,$$

then the gain matrix $\tilde{K}$ exists, which guarantees the error dynamics in Eqn. (57) is exponentially stable.

Figure 17:
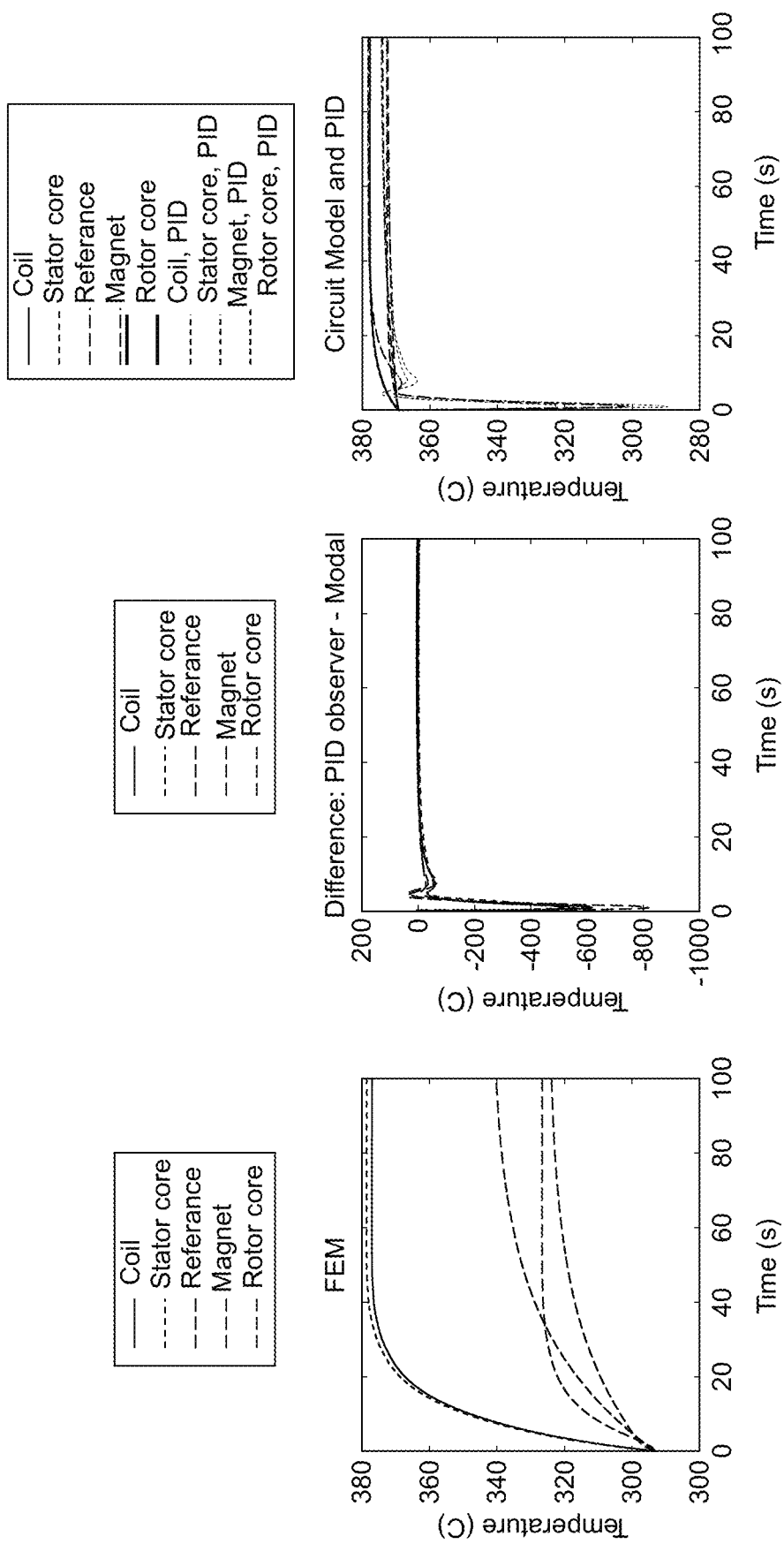
FIG. 17 illustrates numerical simulation results for online estimation of temperature distribution in the electric motor in the presence of model mismatch and measurement noise using a proportional integral derivative (PID) observer.

FIG. 17 illustrates numerical simulation results for online estimation of temperature distribution in the electric motor in the presence of model mismatch and measurement noise using the PID observer.

The thermal management of an electric motor in the manner described herein may provide accurate description of the thermal behavior of the electric motor which may be beneficial in terms of efficient utilization of an electric motor, thermal protection of the electric motor, and monitoring of temperature and heat loss at different parts of the motor.

Figure 18:
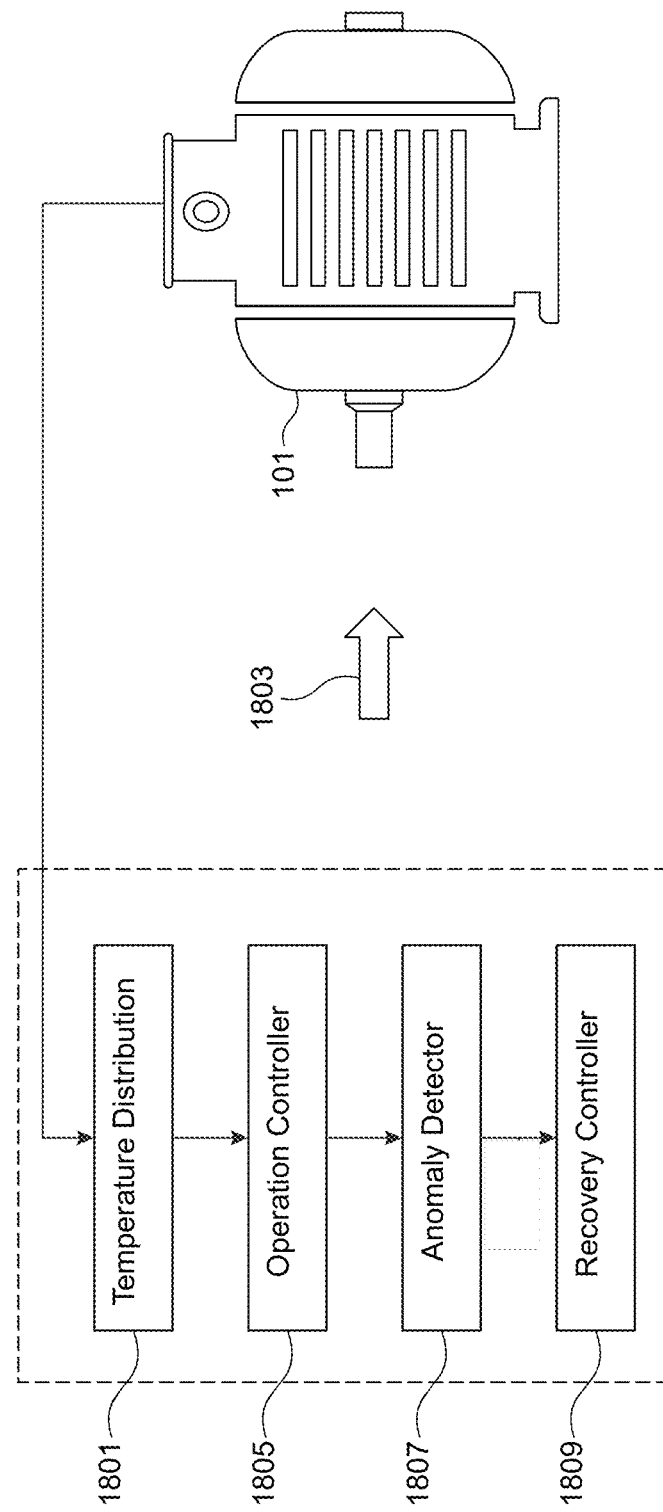
FIG. 18 shows a schematic of a thermal management system used for controlling an operation of an electric motor, according to some embodiments.

FIG. 18 shows a schematic of thermal management system used for controlling an operation of an electric motor 101 according to some embodiments. In these embodiments, the operation of the motor is based on thermal distribution 1801 determined by various embodiments based on augmented thermal circuit model with joint temperature and heat losses estimation.

The thermal management system includes one or combination of an operation controller 1805 configured to control 1803 the electric motor 101 to perform a task, and an anomaly detector 1807 configured to inspect the temperature distributing during the performance of the task, and a recovery controller 1809 configured to cause a modification of the control 1803 of the based on a negative result of the inspection. The modification of the control 1803 may for example, include interruption of operation of the electric motor 101 for further inspection or repair, or reducing the load on the electric motor 101 until the temperature falls below a threshold.

For example, the anomaly detector can compare the temperature distribution 1801 with a set of thresholds, and if an estimated temperature is greater than a corresponding threshold, the recovery controller stops the controlling 1803. Additionally, or alternatively, the recovery controller can alter the control 1803 without stopping the operation. For example, in one embodiment, the recovery controller may initiate a cooling mechanism for the electric motor 101. One example of the cooling mechanism may include forced air cooling by providing an electric fan to blow air over the motor. Forced air cooling reduces the amount of heat transferred into the electric motor 101. In some embodiments, the recovery controller 1809 may increase the rate of circulation of cooling fluids around or over the motor. In this way, embodiments of the present disclosure may provide measures for ensuring optimum performance of the electric motor which in turn may provide protection of the electric motor from running beyond a predefined temperature. Thus, using the thermal management mechanism of the present invention, the performance and life of the electric motor may be improved.

The above-described embodiments of the present invention may be implemented in any of numerous ways. For example, the embodiments may be implemented using hardware, software or a combination thereof. When implemented in software, the software code may be executed on any suitable processor or collection of processors, whether provided in a single computer or distributed among multiple computers. Such processors may be implemented as integrated circuits, with one or more processors in an integrated circuit component.

Also, the various methods or processes outlined herein may be coded as software instructions that are executable on one or more processors that employ any one of a variety of operating systems or platforms. Additionally, such software instructions may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the invention may be embodied as a method, an example of which has been provided with reference to figures. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the invention has been described by way of examples of preferred embodiments, it is to be understood that various other adaptations and modifications may be made within the spirit and scope of the invention.

The invention claimed is:

1. A system for a thermal management of an electric motor, comprising:
    a memory configured to store an augmented thermal circuit model of the electric motor relating temperatures of a set of nodes of the thermal circuit model with temperature measurements at a first subset of the set of nodes and values of heat losses of heat sources at a second subset of the set of nodes, wherein each node in the thermal circuit model represents a spatial location of the electric motor, wherein locations of first subset of nodes and locations of the second subset of nodes are predetermined, while values of the temperatures at the first subset of nodes and values of heat losses at the second subset of nodes are unknown, such that the temperatures of the set of nodes and the values of the heat losses are state variables of the augmented thermal circuit model, and wherein a number of temperature measurements is equal or greater than a number of heat sources, wherein a rank of a thermal management matrix modeling a combination of thermal capacitances of the augmented thermal circuit model, thermal resistances in the augmented thermal circuit model, the locations of the first subset of nodes and the locations of the second subset of nodes of the augmented thermal circuit model not greater than a sum of the number nodes in the set of nodes and the number of heat sources;
    an input interface configured to accept temperature measurements at the locations of the first subset of nodes;
    a processor configured to jointly estimate the values of the temperatures at the set of nodes and the values of the heat losses in the second subset of nodes by solving a joint estimation problem using the augmented thermal circuit model populated with the temperature measurements for the first subset of nodes, wherein, in the joint estimation, the values of the temperatures at the set of nodes and the values of the heat losses in the second subset of nodes are interdependent on each other; and
    an output interface configured to output one or combination of the values of the temperatures of the set of nodes and the values of the heat losses in the second subset of nodes.

2. The system of claim 1, wherein in the augmented thermal circuit model a heat source is mapped to locations of multiple nodes, such that a value of the heat loss determined by the joint estimation is distributed across the locations of multiple nodes.

3. The system of claim 1, wherein the first subset of nodes is selected such that a product of a temperature sensor matrix, an inverse of a thermal resistance matrix and heat source matrix approximates an identity matrix.

4. The system of claim 1, wherein the locations of the first subset of nodes include only locations at a surface of stationary parts of the electrical motor resulting in an ill-conditioned joint estimation problem, and wherein the processor jointly estimates the set of temperatures and the values of the heat loses subject to constraints transforming the ill-conditioned joint estimation problem into a well-conditioned joint estimation problem solved by the processor.

5. The system of claim 4, wherein the constraints transforming the ill-conditioned joint estimation problem into the well-conditioned joint estimation problem include a constraint on a total value of heat losses during the operation of the electric motor.

6. The system of claim 4, wherein the constraints transforming the ill-conditioned joint estimation problem into the well-conditioned joint estimation problem include one or combination of stator winding losses, a total electric input power, a total output torque.

7. The system of claim 1, wherein the input interface is configured to accept measurements of parameters of operation of the electric motor, wherein the memory stores a mapping between different values of the parameters of operation of the electric motor and different values of the heat losses at the second subset of nodes, and wherein the processor is configured to
    determine an initial values of the heat losses by submitting the measurements of parameters of operation of the electric motor to the mapping;
    initialize the joint estimation problem with the initial values of the heat losses; and
    solve the joint estimation problem to produce one or combination of the values of temperature for the entire set of nodes and the values of the heat loses for the second subset of nodes.

8. The system of claim 7, wherein the measurements of parameters of operation of the electric motor are received from one or combination of a voltage sensor, a current sensor, and a rotor speed sensor, and wherein the temperature measurements are received from a set of temperature sensors arranged to measure temperature at the first set of locations.

9. The system of claim 1, wherein the processor solves the joint estimation problem using an observer including one or combination of Kalman filter, a PD observer, an adaptive observer, an L1 adaptive observer, and a Luenberger observer.

10. The system of claim 9, wherein the observer operates on a thermal management matrix to iteratively estimate the values of the temperatures at the set of nodes and the values of the heat losses in the second subset of nodes.

11. The system of claim 1, further comprising:
a recovery controller configured to control the electric motor based on estimations outputted by the output interface.

12. A method for a thermal management of an electric motor, wherein the method uses a processor coupled to a memory storing an augmented thermal circuit model of the electric motor relating temperatures of a set of nodes of the thermal circuit model with temperature measurements at a first subset of the set of nodes and values of heat losses of heat sources at a second subset of the set of nodes, wherein each node in the thermal circuit model represents a spatial location of the electric motor, wherein locations of first subset of nodes and the second subset of nodes are predetermined, while values of the temperatures at the first subset of nodes and values of heat losses at the second subset of nodes are unknown, such that the temperatures of the set of nodes and the values of the heat losses are state variables of the augmented thermal circuit model, and wherein a number of temperature measurements is equal or greater than a number of heat sources, wherein a rank of a thermal management matrix modeling a combination of thermal capacitances of the augmented thermal circuit model, thermal resistances in the augmented thermal circuit model, the locations of the first subset of nodes and the locations of the second subset of nodes of the augmented thermal circuit model not greater than a sum of the number nodes in the set of nodes and the number of heat sources, the processor is coupled with stored instructions when executed by the processor carry out steps of the method, comprising:
accepting temperature measurements at the locations of the first subset of nodes;
jointly estimating the values of the temperatures at the set of nodes and the values of the heat losses in the second subset of nodes by solving a joint estimation problem using the augmented thermal circuit model populated with the temperature measurements for the first subset of nodes, wherein, in the joint estimation, the values of the temperatures at the set of nodes and the values of the heat losses in the second subset of nodes are interdependent on each other; and
outputting one or combination of the values of the temperatures of the set of nodes and the values of the heat losses in the second subset of nodes.

13. The method of claim 12, wherein the locations of the first subset of nodes include only locations at a surface of stationary parts of the electrical motor resulting in an ill-conditioned joint estimation problem, and wherein the processor jointly estimates the set of temperatures and the values of the heat loses subject to constraints transforming the ill-conditioned joint estimation problem into a well-conditioned joint estimation problem solved by the processor.

14. The method of claim 13, wherein the constraints transforming the ill-conditioned joint estimation problem into the well-conditioned joint estimation problem include a constraint on a total value of heat losses during the operation of the electric motor.

15. The method of claim 13, wherein the constraints transforming the ill-conditioned joint estimation problem into the well-conditioned joint estimation problem include one or combination of stator winding losses, a total electric input power, a total output torque.

16. The method of claim 12, further comprising:
accepting measurements of parameters of operation of the electric motor, wherein the memory stores a mapping between different values of the parameters of operation of the electric motor and different values of the heat losses at the second subset of nodes, and wherein the processor is configured to
determining an initial values of the heat losses by submitting the measurements of parameters of operation of the electric motor to the mapping;
initializing the joint estimation problem with the initial values of the heat losses; and
solving the joint estimation problem to produce one or combination of the values of temperature for the entire set of nodes and the values of the heat loses for the second subset of nodes.

17. A non-transitory computer readable storage medium embodied thereon a program executable by a processor for performing a method, the storage medium stores an augmented thermal circuit model of the electric motor relating temperatures of a set of nodes of a thermal circuit model with temperature measurements at the first subset of the set of nodes and values of heat losses of heat sources at a second subset of the set of nodes, wherein each node in the thermal circuit model represents a spatial location of the electric motor, wherein locations of first subset of nodes and the second subset of nodes are predetermined, while values of the temperatures at the first subset of nodes and the values of the heat losses at the second subset of nodes are unknown, such that the temperatures of the set of nodes and values of the heat losses are state variables of the augmented thermal circuit model, and wherein a number of temperature measurements is equal or greater than a number of heat sources, wherein a rank of a thermal management matrix modeling a combination of thermal capacitances of the augmented thermal circuit model, thermal resistances in the augmented thermal circuit model, the locations of the first subset of nodes and the locations of the second subset of nodes of the augmented thermal circuit model not greater than a sum of the number nodes in the set of nodes and the number of heat sources, the program when executed by the processor carry out steps of the method, comprising:
accepting temperature measurements at the locations of the first subset of nodes;
jointly estimating the values of the temperatures at the set of nodes and the values of the heat losses in the second subset of nodes by solving a joint estimation problem using the augmented thermal circuit model populated with the temperature measurements for the first subset of nodes, wherein, in the joint estimation, the values of the temperatures at the set of nodes and the values of the heat losses in the second subset of nodes are interdependent on each other; and
outputting one or combination of the values of the temperatures of the set of nodes and the values of the heat losses in the second subset of nodes.

18. The medium of claim 17, wherein the locations of the first subset of nodes include only locations at a surface of stationary parts of the electrical motor resulting in an ill-conditioned joint estimation problem, and wherein the processor jointly estimates the set of temperatures and the values of the heat loses subject to constraints transforming the ill-conditioned joint estimation problem into a well-condition joint estimation problem solved by the processor, wherein the constraints transforming the ill-conditioned joint estimation problem into the well-conditioned joint estimation problem include one or combination of stator winding losses, a total electric input power, a total output torque, and a total value of heat losses during the operation of the electric motor.

* * * * *